(12) United States Patent
Endo et al.

(10) Patent No.: US 6,261,736 B1
(45) Date of Patent: Jul. 17, 2001

(54) PATTERN FORMING MATERIAL AND PATTERN FORMING METHOD

(75) Inventors: Masayuki Endo; Masamitsu Shirai; Masahiro Tsunooka, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/416,049

(22) Filed: Oct. 12, 1999

Related U.S. Application Data

(62) Division of application No. 09/026,483, filed on Feb. 19, 1998, now Pat. No. 6,017,683.

(30) Foreign Application Priority Data

Feb. 20, 1997 (JP) .................................................. 9-036551
Aug. 18, 1997 (JP) .................................................. 9-221724
Jan. 8, 1998 (JP) ................................................ 10-002300

(51) Int. Cl.$^7$ .................................. G03C 1/73; C08J 3/28
(52) U.S. Cl. .................................... 430/270.1; 430/287.1; 430/905; 430/914; 430/910; 430/919; 430/923; 522/27; 522/28; 522/59; 522/65; 522/151; 522/152; 522/904
(58) Field of Search ............................. 430/270.1, 281.1, 430/283.1, 287.1, 910, 913, 914, 919, 923, 190; 522/151, 152, 27, 28, 65, 59, 904

(56) References Cited

U.S. PATENT DOCUMENTS 5,278,029   1/1994   Shirai et al. ........................... 430/325
5,650,261 * 7/1997   Winkle ............................... 430/270.1

FOREIGN PATENT DOCUMENTS 4226464   2/1994   (DE) .

(List continued on next page.)

OTHER PUBLICATIONS

Endo, et al., "Positive Surface Modification Resist Process using Photobase Generator for 193nm Lithography", Third International symposium on 193nm lithography Digest of Abstracts, p. 89, Jun. 29–Jul. 2, 1997.

Primary Examiner—Hoa Van Le
Assistant Examiner—Sin J. Lee
(74) Attorney, Agent, or Firm—McDermott, Will & Emery

(57) ABSTRACT

The pattern forming material of the present invention includes a polymer having a group which generates an acid when the polymer is irradiated with an energy beam or heated and a compound which generates a base when the compound is irradiated with an energy beam. The polymer is a binary polymer or a polymer of a higher degree obtained by polymerizing another group with a compound represented by the following general formula:

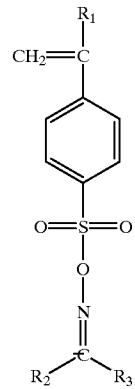

where $R_1$ indicates a hydrogen atom or an alkyl group, and $R_2$ and $R_3$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group.

5 Claims, 9 Drawing Sheets

FOREIGN PATENT DOCUMENTS

| | | |
|---|---|---|
| 0425142 | 5/1991 | (EP) . |
| 0515212 | 11/1992 | (EP) . |
| 0691674 | 1/1996 | (EP) . |
| 0791856A2 * | 8/1997 | (EP) . |
| 06194834 | 7/1994 | (JP) . |
| 07140663 | 6/1995 | (JP) . |
| 07261393 | 10/1995 | (JP) . |
| 08146608 | 6/1996 | (JP) . |
| 09134014 | 5/1997 | (JP) . |
| 10221842 | 8/1998 | (JP) . |

* cited by examiner

PATTERN FORMING MATERIAL AND PATTERN FORMING METHOD

This application is a divisional of application Ser. No. 09/026,483 filed Feb. 19, 1998 now U.S. Pat. No. 6,017,683.

BACKGROUND OF THE INVENTION

The present invention relates to a method for forming a fine resist pattern in a process for fabricating a semiconductor integrated circuit (IC) device and the like (in this specification, such a method will be simply referred to as a "pattern forming method"), and also relates to a material for forming such a pattern used in the method (in a similar manner, such a material will be simply referred to as a "pattern forming material" in this specification).

Conventionally, in fabricating ICs, large-scale integrated circuits (LSIs) and the like, a pattern has been formed by a photolithography process using UV light. However, a light source utilizing a shorter wavelength has been used more and more frequently as the size of a semiconductor device has become increasingly small. Recently, in the case of using a light source utilizing a shorter wavelength, a surface imaging process using a dry development technique has been developed in order to increase the focal depth and to improve a practical resolution.

The surface imaging process is disclosed, for example, in U.S. Pat. No. 5,278,029. The patent discloses a negative type surface modification process. Specifically, according to the disclosed process, first, a polysiloxane film is selectively formed on the surface of a resist film, which is made of a resist material generating an acid when the material is exposed to light. Thereafter, the resist film is dry-etched by using the polysiloxane film as a mask, thereby forming a resist pattern.

Hereinafter, a conventional method for forming the resist pattern will be described with reference to FIGS. 9(a) through 9(d).

In the exemplary method to be described below, a copolymer of 1,2,3,4-tetrahydronaphthylideneimino-p-styrene sulfonate (NISS) and methyl methacrylate (MMA) is assumed to be used as a resist material generating an acid when the material is exposed to light.

First, as shown in FIG. 9(a), when a resist film 11, which is applied on a semiconductor substrate 10 and is made of a material generating an acid through the exposure to light, is irradiated with ArF excimer laser beam 14 by using a mask 13, an acid is generated in an exposed area 11a of the resist film 11. The generated acid contributes to turning the exposed area 11a into a hydrophilic area. As a result, water in the air can be easily adsorbed into the exposed area 11a. Consequently, a thin water-adsorbing layer 15 is formed in the vicinity of the surface of the exposed area 11a as shown in FIG. 9(b).

Next, when an alkoxysilane gas 16 is introduced onto the surface of the resist film 11, the acid, which has been generated on the surface of the exposed area 11a, works as a catalyst, thereby hydrolyzing and dehydrating alkoxysilane. As a result, a metal oxide film 17 is formed on the surface of the exposed area 11a, as shown in FIG. 9(c). Subsequently, when the resist film 11 is dry-etched in accordance with a reactive ion etching (RIE) technique using $O_2$ plasma 18 while using the metal oxide film 17 as a mask, a fine resist pattern 19 is formed as shown in FIG. 9(d).

In this pattern forming method, a resist pattern is formed by performing the steps of: generating an acid in an exposed area of a resist film; selectively forming a metal oxide film in the exposed area by using the generated acid as a catalyst; and dry-etching the resist film by using the metal oxide film as a mask. Thus, this method is a negative type lithography process in which a resist pattern is formed in the exposed area of a resist film.

The negative type lithography process has the following problems in, for example, forming contact holes for connecting multi-layer interconnections of an integrated circuit.

First, the usage itself of a mask, generally employed in an exposure process step, causes the following problems. In the lithography process for forming contact holes, the opening ratio of the mask becomes very high if the negative type lithography process is used as described above. Specifically, a light blocking film against the exposing radiation is formed only in the portions corresponding to the contact holes on the mask. On the other hand, the light blocking film is removed and quartz of the mask substrate is exposed in the portions other than the contact hole portions, because the former portions can transmit the exposing radiation. In general, the ratio of the area occupied by all of the contact holes to the entire area of a semiconductor chip is very small. Thus, the opening ratio of the mask, i.e., the ratio of the area occupied by the exposed quartz to the area of the light blocking film on the mask becomes very high.

When the opening ratio of the mask becomes high, the process is much more likely to be affected by the contamination with ambient dust. More specifically, even when dust is adhered to the light blocking film portions of the mask, the dust hardly affects the process. However, if the dust is adhered to the transmissible portions of the mask, then these portions are turned into light blocking portions. When the exposure is performed by using such a mask to which dust has been adhered, pattern defects are caused in the portions to which the dust has been adhered and the portions corresponding thereto. As can be understood from the foregoing description, since the opening ratio of the mask becomes high in the negative type lithography process, the process is more likely to be affected by dust. As a result, this process has a problem in that the resulting yield is likely to decrease.

Next, a second problem will be described. In the lithography process for forming contact holes, a half-tone type mask is sometimes used in order to attempt to increase the focal depth. However, in most cases, the effect of increasing the focal depth can be attained only in a positive type lithography process and cannot be attained in the negative type lithography process. Thus, in forming contact holes, the focal depth becomes adversely small in the negative type process as compared with the positive type process.

The first and second problems described above are caused not only when the contact holes are formed, but also when a mask having a large light transmissible area is used and when the increase in focal depth is attempted.

SUMMARY OF THE INVENTION

In view of the above-mentioned conventional problems, the present invention has been devised for the purpose of realizing a positive type surface modification process substitutable for the negative type surface modification process.

In order to accomplish this object, according to the present invention, a resist film is made of a polymer including a group which generates an acid when the polymer is heated or irradiated with a first energy beam and a compound which generates a base when the compound is irradiated with a second energy beam having an energy band different from that of the first energy beam. In the exposed area of the resist film, the acid which has been generated from the polymer is neutralized with the base which has been generated from the compound. On the other hand, in the unexposed area of the resist film, the acid which has been generated from the polymer is left and a metal alkoxide is reacted by the catalyst function of the residual acid, thereby forming a metal oxide film.

The first pattern forming material of the present invention includes a polymer including a group which generates an acid when the polymer is heated and a compound which generates a base when the compound is irradiated with an energy beam.

When the resist film, made of the first pattern forming material, is heated, an acid is generated from the polymer over the entire surface of the film. Thereafter, when the resist film is exposed to the energy beam, a base is generated from the compound and the acid which has been generated from the polymer is neutralized with the base which has been generated from the compound in the exposed area of the resist film. On the other hand, in the unexposed area of the resist film, the acid is left. Thus, since the acid can be selectively left only in the unexposed area of the resist film, a positive type surface modification process is realized.

The second pattern forming material of the present invention includes a polymer including a group which generates an acid when the polymer is irradiated with a first energy beam having a first energy band and a compound which generates a base when the compound is irradiated with a second energy beam having a second energy band which is different from the first energy band.

When the entire surface of the resist film, made of the second pattern forming material, is exposed to the first energy beam, an acid is generated from the polymer over the entire surface of the film. When the resist film is exposed to the second energy beam, a base is generated from the compound and the acid which has been generated from the polymer is neutralized with the base which has been generated from the compound in the area of the resist film which has been exposed to the second energy beam. On the other hand, in the area of the resist film which has not been exposed to the second energy beam, the acid is left. Thus, since the acid can be selectively left only in the area of the resist film which has not been exposed to the second energy beam, a positive type surface modification process is realized.

Moreover, since the first or the second pattern forming material is a mixture of a polymer including a group which generates an acid and a compound which generates a base, the polymer and the compound can be mixed at a more flexible ratio.

In the first or the second pattern forming material, the polymer is preferably a binary polymer or a polymer of a higher degree obtained by polymerizing another group with a compound represented by the following general formula:

[Chemical Formula 1]

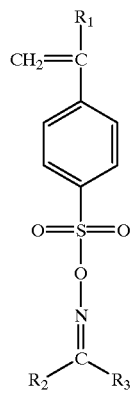

where $R_1$ indicates a hydrogen atom or an alkyl group, and $R_2$ and $R_3$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group. In this case, the ratio of the compound represented by Chemical Formula 1 to the binary polymer or the polymer of a higher degree may be set at an arbitrary value. However, in order to facilitate the neutralization with the base, the ratio is preferably equal to or lower than about 50 mol %.

Furthermore, in the first pattern forming material, the polymer is preferably a binary polymer or a polymer of a higher degree obtained by polymerizing another group with a compound represented by the following general formula:

[Chemical Formula 2]

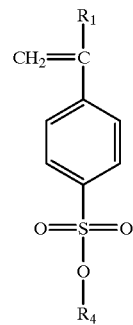

where $R_1$ indicates a hydrogen atom or an alkyl group, and $R_4$ indicates an alkyl group, an alkenyl group, a cyclic alkyl group or a cyclic alkenyl group.

The compound represented by this general formula (Chemical Formula 2) is characterized by hardly generating an acid even when the compound is irradiated with light (or energy beam). In this case, the ratio of the compound represented by Chemical Formula 2 to the binary polymer or the polymer of a higher degree may be set at an arbitrary value. However, in order to facilitate the neutralization with the base, the ratio is preferably equal to or lower than about 50 mol %.

If the polymer is a binary polymer or a polymer of a higher degree obtained by polymerizing another group with the compound represented by the former general formula (Chemical Formula 1) in the first or the second pattern forming material, or if the polymer is a binary polymer or a polymer of a higher degree obtained by polymerizing another group with the compound represented by the latter general formula (Chemical Formula 2) in the first pattern forming material, then sulfonic acid, generated from the polymer, functions as a strong catalyst when a metal oxide film is formed in the unexposed area of the resist film. As a result, a positive type surface modification process is realized at a high contrast.

Moreover, in the first or the second pattern forming material, the compound is preferably acyloxime, a benzyloxycarbonyl compound or formamide.

In such a case, amine is generated in the exposed area of the resist film, and is strongly neutralized with the acid. As a result, a positive type surface modification process is realized at a high contrast.

The first pattern forming method of the present invention includes: a first step of forming a resist film by coating a semiconductor substrate with a pattern forming material including a polymer having a group which generates an acid when the polymer is heated and a compound which generates a base when the compound is irradiated with an energy beam; a second step of generating the acid from the polymer by heating the resist film; a third step of irradiating the resist film with the energy beam through a mask having a desired pattern shape, generating the base from the compound in an exposed area of the resist film and thereby neutralizing the acid which has been generated from the polymer with the base which has been generated from the compound in the exposed area of the resist film; a fourth step of supplying a metal alkoxide onto the resist film and thereby forming a metal oxide film on a surface of an unexposed area of the resist film; and a fifth step of forming a resist pattern of the resist film by dry-etching the resist film by using the metal oxide film as a mask.

In accordance with the first pattern forming method of the present invention, when the resist film is heated, an acid is generated from the polymer over the entire surface of the resist film. Thereafter, when the resist film is exposed to the energy beam, a base is generated from the compound and the acid which has been generated from the polymer is neutralized with the base which has been generated from the compound in the exposed area of the resist film. On the other hand, in the unexposed area of the resist film, the acid is left. Next, when a metal alkoxide is supplied to the resist film, the metal alkoxlde is reacted with the residual acid functioning as a catalyst to form a metal oxide film in the unexposed area of the resist film. On the other hand, since the exposed area of the resist film has been neutralized, no metal oxide film is formed therein. That is to say, the metal oxide film is formed only in the unexposed area of the resist film thanks to the catalytic function of the acid. Thus, by performing a dry etching process by using the metal oxide film as a mask, a fine resist pattern having a desired positive type pattern shape can be formed.

In the first pattern forming method, the fourth step preferably includes a step of causing the unexposed area of the resist film to absorb water.

In such a case, water diffuses from the surface of the resist film into a deep level in the unexposed area of the resist film.

As a result, the thickness of the metal oxide film to be formed on the surface of the unexposed area of the resist film becomes large.

The second pattern forming method of the present invention includes: a first step of forming a resist film by coating a semiconductor substrate with a pattern forming material including a polymer having a group which generates an acid when the polymer is heated, and a compound which generates a base when the compound is irradiated with an energy beam; a second step of generating the base from the compound in an exposed area of the resist film by irradiating the resist film with the energy beam through a mask having a desired pattern shape; a third step of heating the resist film, generating the acid from the polymer and thereby neutralizing the base which has been generated from the compound with the acid which has been generated from the polymer in the exposed area of the resist film; a fourth step of supplying a metal alkoxide onto the resist film and forming a metal oxide film on a surface of an unexposed area of the resist film; and a fifth step of forming a resist pattern of the resist film by dry-etching the resist film by using the metal oxide film as a mask.

In accordance with the second pattern forming method of the present invention, when the resist film is exposed to the energy beam, a base is generated from the compound in the exposed area of the resist film. Thereafter, when the resist film is heated, an acid is generated from the polymer over the entire surface of the resist film. In the exposed area of the resist film, the base which has been generated from the compound is neutralized with the acid which has been generated from the polymer. On the other hand, in the unexposed area of the resist film, the acid is left. Next, when a metal alkoxide is supplied to the resist film, the metal alkoxide is reacted with the residual acid functioning as a catalyst to form a metal oxide film in the unexposed area of the resist film. On the other hand, since the exposed area of the resist film has been neutralized, no metal oxide film is formed therein. That is to say, the metal oxide film is formed only in the unexposed area of the resist film thanks to the catalytic function of the acid. Thus, by performing a dry etching process by using the metal oxide film as a mask, a fine resist pattern having a desired positive type pattern shape can be formed.

In the first or the second pattern forming method, the fourth step preferably includes a step of causing the unexposed area of the resist film to absorb water.

In such a case, water diffuses from the surface of the resist film into a deep level in the unexposed area of the resist film. As a result, the thickness of the metal oxide film to be formed on the surface of the unexposed area of the resist film becomes large.

The third pattern forming method of the present invention includes: a first step of forming a resist film by coating a semiconductor substrate with a pattern forming material including a compound which generates a base when the compound is irradiated with a first energy beam having a first energy band and a polymer which generates an acid when the polymer is irradiated with a second energy beam having a second energy band which is different from the first energy band; a second step of generating the base from the compound in an area of the resist film which has been exposed to the first energy beam by irradiating the resist film with the first energy beam through a mask having a desired pattern shape; a third step of irradiating an entire surface of the resist film with the second energy beam, generating the acid from the polymer over the entire surface of the resist film and thereby neutralizing the base which has been generated from the compound with the acid which has been generated from the polymer in the area of the resist film which has been exposed to the first energy beam; a fourth step of supplying a metal alkoxide onto the resist film and thereby forming a metal oxide film on a surface of an area of the resist film which has not been exposed to the first energy beam; and a fifth step of forming a resist pattern of the resist film by dry-etching the resist film by using the metal oxide film as a mask.

In accordance with the third pattern forming method of the present invention, when the resist film is exposed to the first energy beam, a base is generated from the compound in the area of the resist film which has been exposed to the first energy beam. Thereafter, when the entire surface of the resist film is exposed to the second energy beam, an acid is generated from the polymer. In the area of the resist film which has been exposed to the first energy beam, the base which has been generated from the compound is neutralized with the acid which has been generated from the polymer. On the other hand, in the area of the resist film which has not been exposed to the first energy beam, the acid is left. Next, when a metal alkoxide is supplied to the resist film, the metal alkoxide is reacted with the residual acid functioning as a catalyst to form a metal oxide film in the area of the resist film which has not been exposed to the first energy beam. On the other hand, since the area of the resist film, which has been exposed to the first energy beam, has been neutralized, no metal oxide film is formed therein. That is to say, the metal oxide film is formed only in the area of the resist film which has not been exposed to the first energy beam thanks to the catalytic function of the acid. Thus, by performing a dry etching process by using the metal oxide film as a mask, a fine resist pattern having a desired positive type pattern shape can be formed.

In the third pattern forming method, the fourth step preferably includes a step of causing the area of the resist film, which has not been exposed to the first energy beam, to absorb water.

In such a case, water diffuses from the surface of the resist film into a deep level in the area of the resist film which has not been exposed to the first energy beam. As a result, the thickness of the metal oxide film to be formed on the surface of the area of the resist film, which has not been exposed to the first energy beam, becomes large.

The fourth pattern forming method of the present invention includes: a first step of forming a resist film by coating a semiconductor substrate with a pattern forming material including a polymer which generates an acid when the polymer is irradiated with a first energy beam having a first energy band and a compound which generates a base when the compound is irradiated with a second energy beam having a second energy band which is different from the first energy band; a second step of generating the acid from the polymer in the resist film by irradiating an entire surface of the resist film with the first energy beam; a third step of irradiating the resist film with the second energy beam through a mask having a desired pattern shape, generating the base from the compound in an area of the resist film which has been exposed to the second energy beam and thereby neutralizing the acid which has been generated from the polymer with the base which has been generated from the compound in the area of the resist film which has been exposed to the second energy beam; a fourth step of supplying a metal alkoxide onto the resist film and thereby forming a metal oxide film on a surface of an area of the resist film which has not been exposed to the second energy beam; and a fifth step of forming a resist pattern of the resist film by dry-etching the resist film by using the metal oxide film as a mask.

In accordance with the fourth pattern forming method of the present invention, when the entire surface of the resist film is exposed to the first energy beam, an acid is generated from the polymer over the entire surface of the resist film. Thereafter, when the resist film is exposed to the second energy beam, a base is generated from the compound and the acid which has been generated from the polymer is neutralized with the base which has been generated from the compound in the area of the resist film which has been exposed to the second energy beam. On the other hand, in the area of the resist film which has not been exposed to the second energy beam, the acid is left. Next, when a metal alkoxide is supplied to the resist film, the metal alkoxide is reacted with the residual acid functioning as a catalyst to form a metal oxide film in the area of the resist film which has not been exposed to the second energy beam. On the other hand, since the area of the resist film which has been exposed to the second energy beam has been neutralized, no metal oxide film is formed therein. That is to say, the metal oxide film is formed only in the area of the resist film which has not been exposed to the second energy beam thanks to the catalytic function of the acid. Thus, by performing a dry etching process by using the metal oxide film as a mask, a fine resist pattern having a desired positive type pattern shape can be formed.

In the fourth pattern forming method, the fourth step preferably includes a step of causing the area of the resist film, which has not been exposed to the second energy beam, to absorb water.

In such a case, water diffuses from the surface of the resist film into a deep level in the area of the resist film which has not been exposed to the second energy beam. As a result, the thickness of the metal oxide film to be formed on the surface of the area of the resist film, which has not been exposed to the second energy beam, becomes large.

In the first to the fourth pattern forming methods, the polymer is preferably a binary polymer or a polymer of a higher degree obtained by polymerizing another group with the compound represented by the following general formula

[Chemical Formula 1]

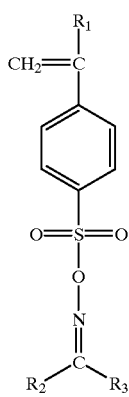

where $R_1$ indicates a hydrogen atom or an alkyl group, and $R_2$ and $R_3$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group. In this case, the ratio of the compound represented by this general formula (Chemical Formula 1) to the binary polymer or the polymer of a higher degree may be set at an arbitrary value. However, in order to facilitate the neutralization with the base, the ratio is preferably equal to or lower than about 50 mol %.

Furthermore, in the first or the second pattern forming method, the polymer is preferably a binary polymer or a polymer of a higher degree obtained by polymerizing another group with a compound represented by the following general formula:

[Chemical Formula 2]

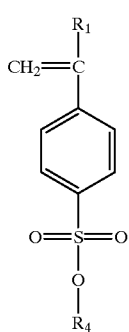

where $R_1$ indicates a hydrogen atom or an alkyl group, and $R_4$ indicates an alkyl group, an alkenyl group, a cyclic alkyl group or a cyclic alkenyl group.

The compound represented by this general formula (Chemical Formula 2) is characterized by hardly generating an acid even when the compound is irradiated with light (or energy beam). In this case, the ratio of the compound represented by this general formula (Chemical Formula 2) to the binary polymer or the polymer of a higher degree may be set at an arbitrary value. However, in order to facilitate the neutralization with the base, the ratio is preferably equal to or lower than about 50 mol %.

If the polymer is a binary polymer or a polymer of a higher degree obtained by polymerizing another group with the compound represented by the former general formula (Chemical Formula 1) in the first to the fourth pattern forming methods, or if the polymer is a binary polymer or a polymer of a higher degree obtained by polymerizing another group with the compound represented by the latter general formula (Chemical Formula 2) in the first pattern forming method, then sulfonic acid functions as a strong catalyst when a metal oxide film is formed in the unexposed area of the resist film. As a result, a metal oxide film having a high selectivity can be formed only in the unexposed area of the resist film, and thus a more fine resist pattern having a desired positive type pattern shape can be formed.

Moreover, in the first to the fourth pattern forming methods, the compound is preferably acyloxime, a benzyloxy-carbonyl compound or formamide. Specifically, acyloxime may be O-phenylacetyl-aceto-α-naphtone-oxime, O-phenylacetyl-aceto-β-phenone-oxime, O-phenylacetyl-acetophenone-oxime or the like.

In such a case, amine is generated in the exposed area of the resist film, and is strongly neutralized with the acid. As a result, a metal oxide film having a high selectivity can be formed only in the unexposed area of the resist film, and a more fine resist pattern having a desired positive type pattern shape can be formed.

The fifth pattern forming method of the present invention includes: a first step of forming a resist film by coating a semiconductor substrate with a pattern forming material including a polymer having a group which generates an acid when the polymer is heated and a compound which generates a base when the compound is irradiated with an energy beam; a second step of generating the acid from the polymer by heating the resist film; a third step of irradiating the resist film with the energy beam through a mask having a desired pattern shape so as to transfer the pattern, performing a water treatment on the resist film in a vapor phase or in a liquid phase, and thereby generating the base from the compound in an exposed area of the resist film and neutralizing the base which has been generated from the compound with the acid which has been generated from the polymer in the exposed area of the resist film; a fourth step of exposing the resist film to a water vapor environment and then to a mixed gas environment of water vapor and a metal alkoxide and thereby forming a metal oxide film on a surface of an unexposed area of the resist film; and a fifth step of forming a resist pattern of the resist film by dry-etching the resist film by using the metal oxide film as a mask.

In accordance with the fifth pattern forming method of the present invention, after the resist film, in which the acid has been generated, is exposed to light, a water treatment is performed on the resist film in a vapor phase or in a liquid phase. Thus, in the exposed area of the resist film, a sufficient amount of base for neutralizing the acid of the resist film is generated from the compound, so that the acid is not left. As a result, no metal oxide film is formed in the exposed area. Therefore, no residue of the metal oxide film is formed on the semiconductor substrate after a resist pattern has been formed thereon.

The sixth pattern forming method of the present invention includes: a first step of forming a resist film by coating a semiconductor substrate with a pattern forming material including a polymer having a group which generates an acid when the polymer is heated and a compound which generates a base when the compound is irradiated with an energy beam; a second step of generating the acid from the polymer by heating the resist film; a third step of irradiating the resist film with the energy beam through a mask having a desired pattern shape so as to transfer the pattern, retaining the resist film within an inert gas environment, and thereby generating the base from the compound in an exposed area of the resist film and neutralizing the base which has been generated from the compound with the acid which has been generated from the polymer in the exposed area of the resist film; a fourth step of exposing the resist film to a water vapor environment and then to a mixed gas environment of water vapor and a metal alkoxide and thereby forming a metal oxide film on a surface of an unexposed area of the resist film; and a fifth step of forming a resist pattern of the resist film by dry-etching the resist film by using the metal oxide film as a mask.

In accordance with the sixth pattern forming method of the present invention, after the resist film, in which an acid has been generated, is exposed to light, the resist film is retained within an inert gas environment. Thus, in the exposed area of the resist film, a sufficient amount of base for neutralizing the acid of the resist film is generated from the compound, so that the acid is not left. As a result, no metal oxide film is formed in the exposed area. Therefore, no residue of the metal oxide film is formed on the semiconductor substrate after a resist pattern has been formed thereon.

The seventh pattern forming method of the present invention includes: a first step of forming a resist film by coating a semiconductor substrate with a pattern forming material including a polymer having a group which generates an acid when the polymer is heated and a compound which generates a base when the compound is irradiated with an energy beam; a second step of generating the acid from the polymer by heating the resist film; a third step of irradiating the resist film with the energy beam through a mask having a desired pattern shape so as to transfer the pattern, exposing the resist film to a water vapor environment within an inert gas environment, and thereby generating the base from the compound in an exposed area of the resist film and neutralizing the base which has been generated from the compound with the acid which has been generated from the polymer in the exposed area of the resist film; a fourth step of exposing the resist film to a mixed gas environment of water vapor and a metal alkoxide and thereby forming a metal oxide film on a surface of an unexposed area of the resist film; and a fifth step of forming a resist pattern of the resist film by dry-etching the resist film by using the metal oxide film as a mask.

In accordance with the seventh pattern forming method of the present invention, after the resist film, in which an acid has been generated, is exposed to light, the resist film is exposed to a water vapor environment within an inert gas environment. Thus, in the exposed area of the resist film, a sufficient amount of base for neutralizing the acid of the resist film is generated from the compound, and the acid is not left. As a result, no metal oxide film is formed in the exposed area. Therefore, no residue of the metal oxide film is formed on the semiconductor substrate after a resist pattern has been formed thereon.

In addition, in accordance with the seventh pattern forming method, since the resist film is exposed to a water vapor environment within an inert gas environment, it is possible to omit the step of exposing the resist film to a water vapor environment, which step is to be performed before the step of exposing the resist film to a mixed gas environment of water vapor and a metal alkoxide is performed.

Thus, in accordance with the fifth to the seventh pattern forming methods of the present invention, since no residue of the metal oxide film is formed on the semiconductor substrate after a resist pattern has been formed thereon, it is possible to eliminate the defect factors resulting from such a residue during succeeding process steps. As a result, the yield can be increased in a semiconductor fabrication process.

DETAILED DESCRIPTION OF THE INVENTION

Embodiment 1

FIGS. 1(a) through 1(d) are cross-sectional views showing the respective process steps of a pattern forming method in the first embodiment of the present invention.

As a resist material, a mixture obtained by dissolving, in diglyme, a copolymer represented by Chemical Formula 3 (i.e., a polymer including a group which generates an acid when the polymer is heated) and a compound represented by Chemical Formula 4 (i.e., a compound which generates a base when the compound is irradiated with an energy beam (ArF excimer laser beam)) is used.

[Chemical Formula 3]

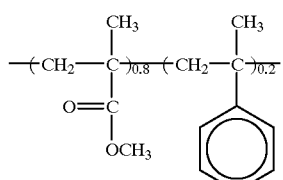

Figure 1A:
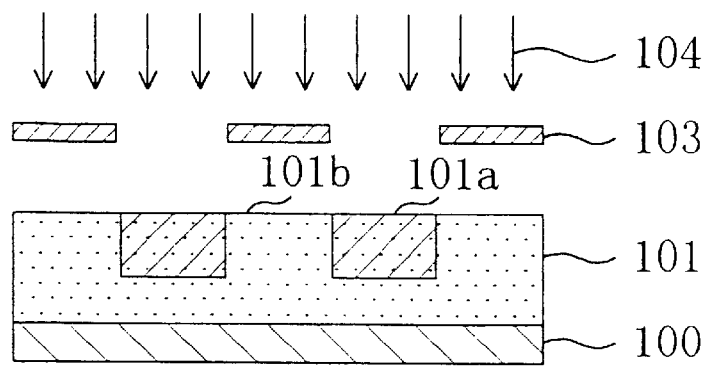
FIGS. 1(a) through 1(d) are cross-sectional views showing the respective process steps of a pattern forming method in the first embodiment of the present invention.

First, as shown in FIG. 1(a), the resist material is spin-coated onto a semiconductor substrate 100 made of silicon and the coated semiconductor substrate is pre-baked at a temperature of about 90° C. for about 90 seconds, thereby forming a resist film 101 having a thickness of about 1 μm. At this point, no peeling is observed and the resist film 101 shows satisfactory adhesion. In addition, as represented by Chemical Formula 5, sulfonic acid is generated from the copolymer represented by Chemical Formula 3 because of the heat generated by the pre-baking.

[Chemical Formula 5]

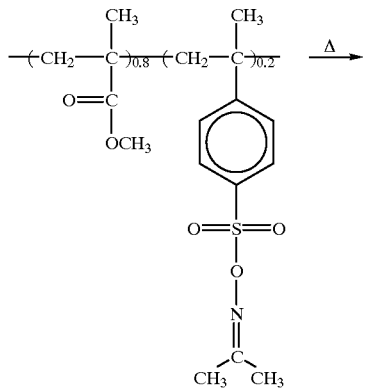
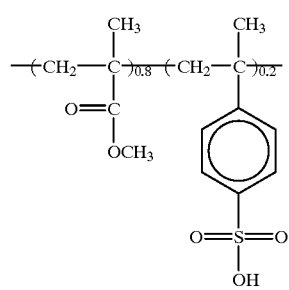

Next, by using a mask 103, the resist film 101 is irradiated with ArF excimer laser beam 104 as energy beam, thereby transferring the pattern of the mask 103 onto the resist film 101. Then, O-phenylacetyl-acetophenone-oxime is decomposed to generate benzylamine on the surface of an exposed area 101a of the resist film 101 as represented by the chemical reaction in Chemical Formula 6.

[Chemical Formula 6]

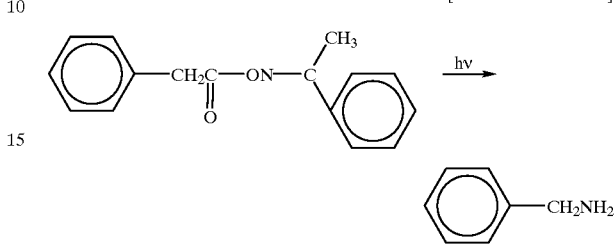
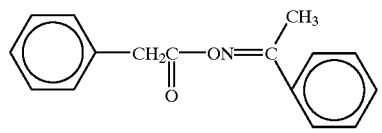

An unexposed area 101b of the resist film 101 shows strong acidic properties owing to the function of a sulfonic acid group shown in Chemical Formula 5. On the other hand, in the exposed area 101a of the resist film 101, O-phenylacetyl-acetophenone-oxime is decomposed to generate benzylamine having basic properties as represented by the chemical reaction in Chemical Formula 6. Since benzylamine cancels the acidic properties resulting from the function of the sulfonic acid group, a neutralization proceeds to a certain degree.

Since the unexposed area 101b of the resist film 101 shows the strong acidic properties, water is more easily adsorbed into the unexposed area 101b as compared with the exposed area 101a which has been neutralized. In other words, since a group having strong acidic properties exists in the unexposed area 101b, hydrogen bonding with water is strengthened in the unexposed area 101b and thus water is more likely to be absorbed thereto. In contrast, in the exposed area 101a, hydrogen bonding with water is weakened by the neutralization and thus water is less likely to be absorbed thereto.

Figure 1B:
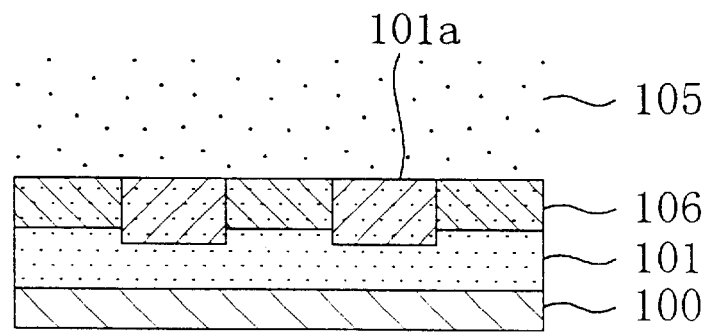

Next, as shown in FIG. 1(b), the semiconductor substrate 100 is retained in the air having a relative humidity of about 95% at a temperature of about 30° C. for about 30 minutes, thereby supplying water vapor 105 onto the surface of the resist film 101. Then, water vapor 105 is adsorbed into the surface of the unexposed area 101b, into which water is more likely to be adsorbed, so that the adsorbed water diffuses into a deep level, for example, at a depth of about 100 nm from the surface of the unexposed area 101b. Since the exposed area 101a has been neutralized, water is less likely to be adsorbed thereto. As a result, a water-adsorbing layer 106 is selectively formed in the unexposed area 101b.

Figure 1C:
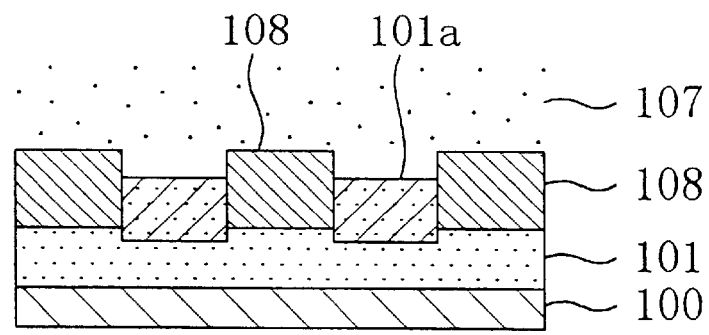

Then, as shown in FIG. 1(c), while retaining the semiconductor substrate 100 in the air having a relative humidity of about 95% at a temperature of about 30° C., vapor 107 of methyltriethoxysilane (MTEOS) is sprayed as a metal alkoxide onto the surface of the resist film 101 for about 30 minutes. As a result, a metal oxide film 108 is selectively formed on the surface of the unexposed area 101b of the resist film 101. In this case, an acid ($H^{3O}$) derived from sulfonic acid works as a catalyst to produce the hydrolysis and the dehydration of MTEOS, thereby forming the metal oxide film 108. Therefore, the metal oxide film 108 grows only in the area where both the acid ($H^+$) serving as the catalyst and water exist.

In the first embodiment, no metal oxide film is formed in the exposed area 101a of the resist film 101 because sulfonic acid is neutralized by the generated benzylamine and loses its function as a catalyst and because water is less likely to be absorbed thereto. In contrast, the metal oxide film 108 is formed in the unexposed area 101b of the resist film 101 because $H^+$ serving as the catalyst exists there and a sufficient amount of water has been absorbed thereto.

Figure 1D:
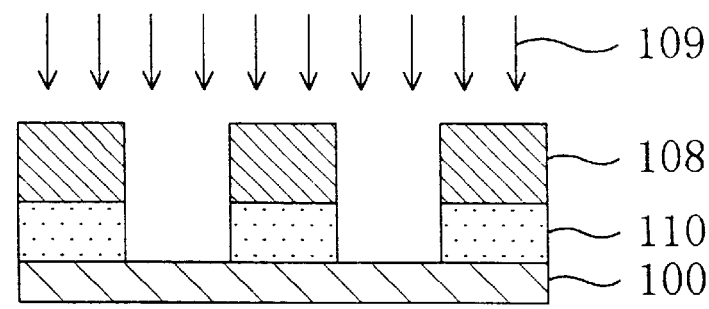

Next, as shown in FIG. 1(d), by using the metal oxide film 108 as a mask, an RIE (reactive ion etching) process is performed by using $O_2$ plasma 109, thereby forming a resist pattern 110. In this case, the RIE process using $O_2$ plasma is performed by using a parallel plate RIE system under the conditions where a power of about 900 W is supplied, a pressure of about 0.7 Pa is applied and a flow rate is set at about 40 SCCM.

In the first embodiment, since the metal oxide film 108 is selectively formed only in the unexposed area 101b and the etching process is performed by using the metal oxide film 108 as a mask, a positive type resist pattern 110 having a vertical cross-sectional shape and a width of about 0.15 μm can be formed in the unexposed area 101b.

Furthermore, since water vapor 105 is supplied to the resist film 101 in the process step shown in FIG. 1(b), water diffuses from the surface of the unexposed area 110b of the resist film 101 into a deep level. Thus, the metal oxide film 108 grows so as to extend toward the inside of the resist film 101. As a result, a metal oxide film 108 having a large thickness can be formed.

In addition, since MTEOS is supplied to the resist film 101 in the air having a relative humidity of about 95% in the process step shown in FIG. 1(c), the equilibrium of water can be maintained. This is because it is possible to prevent the water, which has been absorbed into the resist film 101, from evaporating therefrom and because a sufficient amount of water required for forming the metal oxide film 108 can be supplied thereto. As a result, a metal oxide film 108 thick enough to withstand the RIE process using $O_2$ plasma can be formed.

As described above, in this first embodiment, the resist film 101, in which an acid has been generated from the copolymer through a heat treatment, is exposed to light. In the exposed area 101a, a base is generated to neutralize the acidic properties of the exposed area 101a, while the metal oxide film 108 is selectively formed only in the unexposed area 101b. Thereafter, by using the metal oxide film 108 as a mask, the resist film 101 is etched. Thus, it is possible to form a positive type fine resist pattern 110 having a desired shape.

Also, since water is forcedly absorbed into the unexposed area 101b before the metal oxide film 108 is grown, it is possible to form a metal oxide film 108 having a sufficiently large thickness required for the dry development by the RIE process using $O_2$ plasma.

Furthermore, MTEOS is used as a metal alkoxide in this embodiment. Alternatively, any other metal alkoxide such as $CH_3Si(OCH_3)_3$ (methyltrimethoxysilane), $Si(OCH_3)_4$ (tetramethoxysilane), $Si(OC_2H_5)_4$ (tetraethoxysilane), $Ti(OC_2H_5)_4$, $Ge(OC_2H_5)_4$, $Al(OC_2H_5)_3$ or $Zr(OC_2H_5)_3$ may be supplied in a vapor phase or in a liquid phase.

Also, the dry development is performed by the RIE process using $O_2$ plasma in this embodiment. As an alternative, an ECR (electron cyclotron resonance) etching process using $O_2$ plasma may be performed. Moreover, a mixture gas in which $SO_2$ gas or the like is added to $O_2$ gas may be used as an alternative etching gas.

Furthermore, the exposing radiation is assumed to be an ArF excimer laser beam in this embodiment. Alternatively, an i-beam, a KrF excimer laser beam, VUV, EUV, EB, an X-ray or the like may also be used.

Furthermore, in the process step of diffusing water in the surface region of the unexposed area 101b of the resist film 101, the semiconductor substrate 100 is retained within water vapor in this embodiment. Alternatively, water in a liquid phase may be supplied to the resist film 101 on the semiconductor substrate 100. However, water can be more rapidly diffused and the depth of the metal oxide film 108 can be increased when water is supplied in a vapor phase than in a liquid phase. Thus, water is preferably supplied in a vapor phase.

Embodiment 2

FIGS. 2(a) through 2(d) are cross-sectional views showing the respective process steps of a pattern forming method in the second embodiment of the present invention.

A mixture obtained by dissolving, in diglyme, a copolymer represented by Chemical Formula 7 (i.e., a polymer including a group which generates an acid when the polymer is heated) and a compound represented by Chemical Formula 8 (i.e., a compound which generates a base when the compound is irradiated with an energy beam (an ArF excimer laser beam)) is used as a resist material.

[Chemical Formula 7]

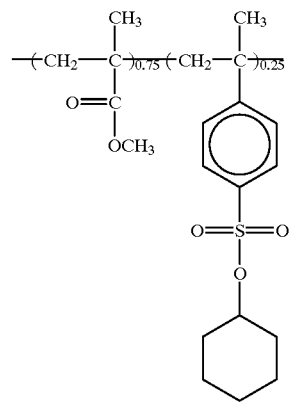

[Chemical Formula 8]

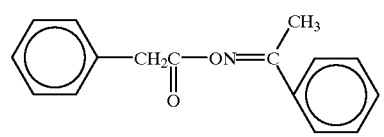

Figure 2A:
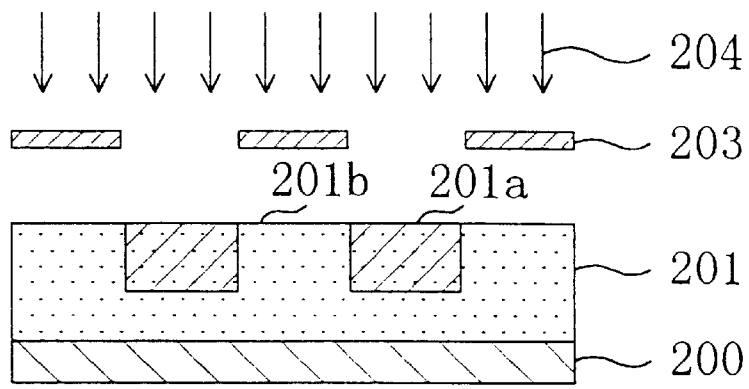
FIGS. 2(a) through 2(d) are cross-sectional views showing the respective process steps of a pattern forming method in the second or the third embodiment of the present invention.

First, as shown in FIG. 2(a), the resist material is spin-coated onto a semiconductor substrate 200 made of silicon and the coated semiconductor substrate is pre-baked at a temperature of about 120° C. for about 90 seconds, thereby forming a resist film 201 having a thickness of about 1 μm.

At this point, no peeling is observed and the resist film 201 shows satisfactory adhesion. In addition, as represented by Chemical Formula 9, sulfonic acid is generated from the copolymer represented by Chemical Formula 7 because of the heat generated by the pre-baking.

[Chemical Formula 9]

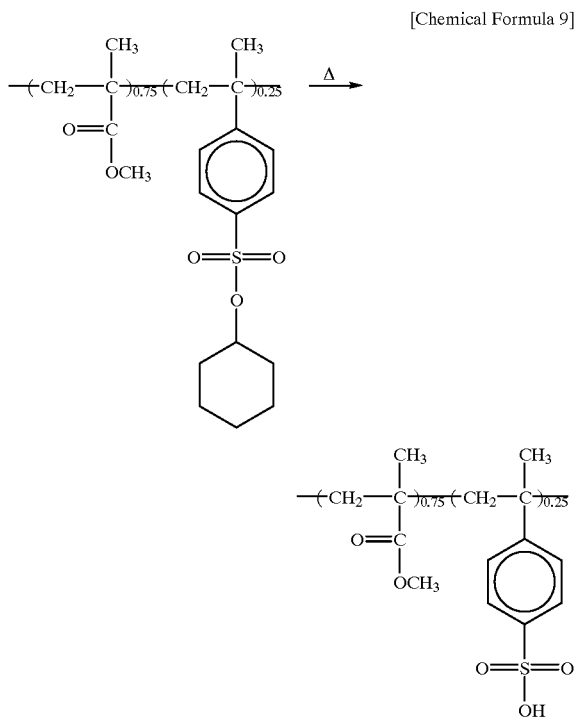

Next, by using a mask 203, the resist film 201 is irradiated with an ArF excimer laser beam 204 as an energy beam, thereby transferring the pattern of the mask 203 onto the resist film 201. Then, O-phenylacetyl-acetophenone-oxime is decomposed to generate benzylamine on the surface of an exposed area 201a of the resist film 201, as represented by the chemical reaction in Chemical Formula 10.

[Chemical Formula 10]

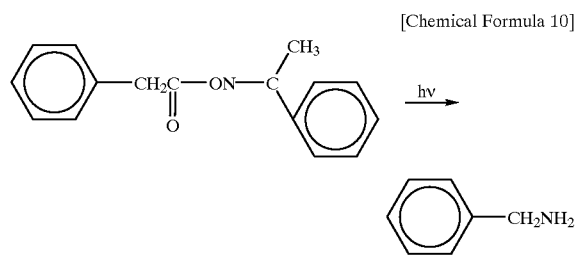

An unexposed area 201b of the resist film 201 shows strong acidic properties owing to the function of a sulfonic acid group shown in Chemical Formula 9. On the other hand, in the exposed area 201a of the resist film 201, O-phenylacetyl-acetophenone-oxime is decomposed to generate benzylamine having basic properties as represented by the chemical reaction in Chemical Formula 10. Since benzylamine cancels the acidic properties resulting from the function of the sulfonic acid group, a neutralization proceeds to a certain degree.

Since the unexposed area 201b of the resist film 201 shows the strong acidic properties, water is more easily adsorbed into the unexposed area 201b as compared with the exposed area 201a which has been neutralized. In other words, since a group having strong acidic properties exists in the unexposed area 201b, hydrogen bonding with water is strengthened in the unexposed area 201b and thus water is more likely to be absorbed thereto. In contrast, in the exposed area 201a, hydrogen bonding with water is weakened by the neutralization and thus water is less likely to be absorbed thereto.

Figure 2B:
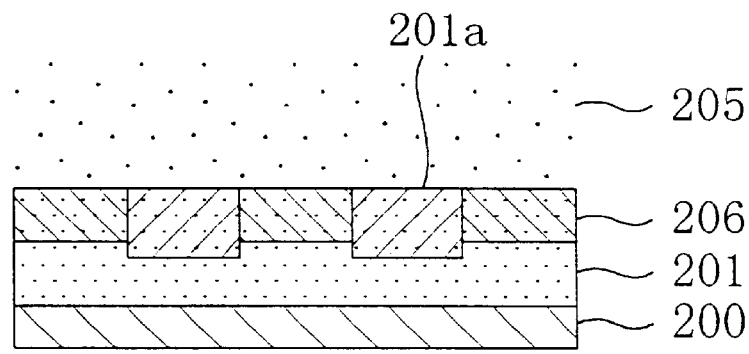

Next, as shown in FIG. 2(b), the semiconductor substrate 200 is retained in the air having a relative humidity of about 95% at a temperature of about 30° C. for about 30 minutes, thereby supplying water vapor 205 onto the surface of the resist film 201. Then, water vapor 205 is adsorbed into the surface of the unexposed area 201b, into which water is more likely to be adsorbed, and the adsorbed water diffuses into a deep level, for example, at a depth of about 100 nm from the surface of the unexposed area 201b. Since the exposed area 201a has been neutralized, water is less likely to be adsorbed thereto. As a result, a water-adsorbing layer 206 is selectively formed in the unexposed area 201b.

Figure 2C:
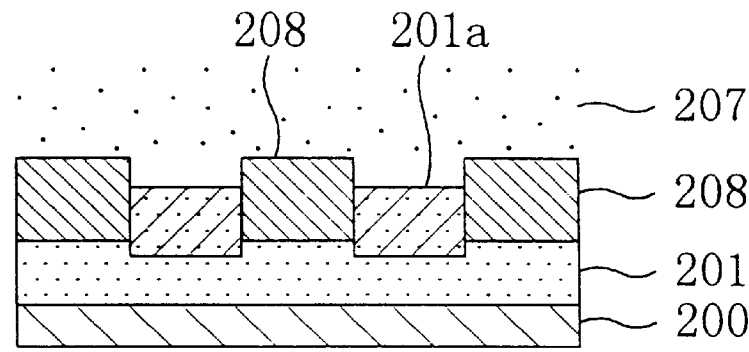

Then, as shown in FIG. 2(c), while retaining the semiconductor substrate 200 in the air having a relative humidity of about 95% at a temperature of about 30° C., vapor 207 of methyltrimethoxysilane (MTMOS) is sprayed as a metal alkoxide onto the surface of the resist film 201 for about 20 minutes. As a result, a metal oxide film 208 is selectively formed on the surface of the unexposed area 201b of the resist film 201. In this case, the acid ($H^+$) derived from sulfonic acid works as a catalyst to produce the hydrolysis and the dehydration of MTMOS, thereby forming the metal oxide film 208. Therefore, the metal oxide film 208 grows only in the area where both the acid ($H^+$) serving as the catalyst and water exist.

In the second embodiment, no metal oxide film is formed in the exposed area 201a of the resist film 201 because sulfonic acid is neutralized by the generated benzylamine and loses its function as a catalyst and because water is less likely to be absorbed thereto. In contrast, the metal oxide film 208 is formed in the unexposed area 201b of the resist film 201 because $H^+$ serving as a catalyst exists there and a sufficient amount of water has been absorbed thereto.

Figure 2D:
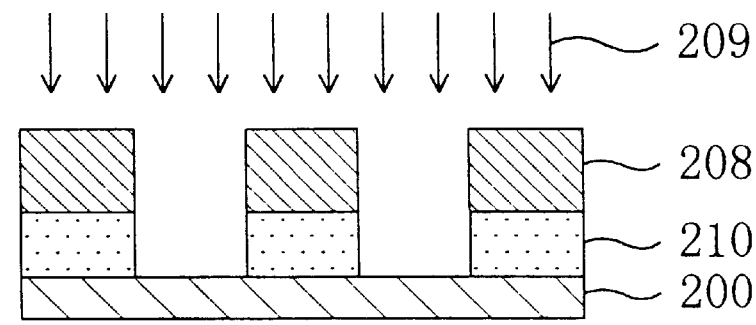

Next, as shown in FIG. 2(d), by using the metal oxide film 208 as a mask, an RIE (reactive ion etching) process is performed by using $O_2$ plasma 209, thereby forming a resist pattern 210. In this case, the RIE process using $O_2$ plasma is performed by using a parallel plate RIE system under the conditions where a power of about 900 W is supplied, a pressure of about 0.7 Pa is applied and a flow rate is set at about 40 SCCM.

In the second embodiment, since the metal oxide film 208 is selectively formed only in the unexposed area 201b and the etching is performed by using the metal oxide film 208 as a mask, a positive type resist pattern 210 having a vertical cross-sectional shape and a width of about 0.15 μm can be formed in the unexposed area 201b.

Furthermore, since water vapor 205 is supplied to the resist film 201 in the process step shown in FIG. 2(b), water diffuses from the surface of the unexposed area 201b of the resist film 201 into a deep level. Thus, the metal oxide film 208 grows so as to extend toward the inside of the resist film 201. As a result, a metal oxide film 208 having a large thickness can be formed.

In addition, since MTMOS is supplied to the resist film 201 in the air having a relative humidity of about 95% in the process step shown in FIG. 2(c), the equilibrium of water can be maintained. This is because it is possible to prevent the water, which has been absorbed into the resist film 201, from evaporating therefrom and because a sufficient amount of water required for forming the metal oxide film 208 can be supplied thereto. As a result, a metal oxide film 208 thick enough to withstand the RIE process using $O_2$ plasma can be formed.

As described above, in this second embodiment, the resist film 201, in which an acid has been generated from the copolymer through a heat treatment, is exposed to light. In the exposed area 201a, a base is generated to neutralize the acidic properties of the exposed area 201a, while the metal oxide film 208 is selectively formed only in the unexposed area 201b. Thereafter, by using the metal oxide film 208 as a mask, the resist film 201 is etched. Thus, it is possible to form a positive type fine resist pattern 210 having a desired shape.

Also, since water is forcedly absorbed into the unexposed area 201b before the metal oxide film 208 is grown, it is possible to form a metal oxide film 208 having a sufficiently large thickness required for the dry development by the RIE process using $O_2$ plasma.

In this embodiment, MTMOS is used as a metal alkoxide. Alternatively, any other metal alkoxide such as $CH_3Si(OC_2H_5)_3$ (methyltriethoxysilane), $Si(OCH_3)_4$ (tetramethoxysilane), $Si(OC_2H_5)_4$ (tetraethoxysilane), $Ti(OC_2H_5)_4$, $Ge(OC_2H_5)_4$, $Al(OC_2H_5)_3$ or $Zr(OC_2H_5)_3$ may be supplied in a vapor phase or in a liquid phase.

Also, the dry development is performed by the RIE process using $O_2$ plasma in this embodiment. As an alternative, an ECR (electron cyclotron resonance) etching process using $O_2$ plasma may be performed. Moreover, a mixture gas in which $SO_2$ gas or the like is added to $O_2$ gas may be used as an alternative etching gas.

Furthermore, the exposing radiation is assumed to be an ArF excimer laser beam in this embodiment. Alternatively, an i-beam, a KrF excimer laser beam, VUV, EUV, EB, an X-ray or the like may also be used.

Furthermore, in the process step of diffusing water in the surface region of the unexposed area 201b of the resist film 201, the semiconductor substrate 200 is retained within water vapor in this embodiment. Alternatively, water in a liquid phase may be supplied to the resist film 201 on the semiconductor substrate 200. However, water can be more rapidly diffused and the depth of the metal oxide film 208 can be increased when water is supplied in a vapor phase than in a liquid phase. Thus, water is preferably supplied in a vapor phase.

Embodiment 3

FIGS. 2(a) through 2(d) are cross-sectional views showing the respective process steps of a pattern forming method in the third embodiment of the present invention.

A mixture obtained by dissolving, in monoglyme, a copolymer represented by Chemical Formula 11 (i.e., a polymer including a group which generates an acid when the polymer is heated) and a compound represented by Chemical Formula 12 (i.e., a compound which generates a base when the compound is irradiated with an energy beam (an ArF excimer laser beam)) is used as a resist material.

[Chemical Formula 11]

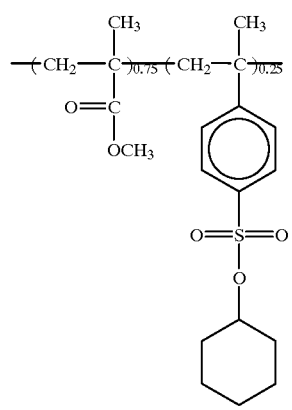

[Chemical Formula 12]

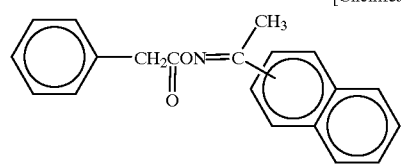

First, as shown in FIG. 2(a), the resist material is spin-coated onto a semiconductor substrate 200 made of silicon and the coated semiconductor substrate is pre-baked at a temperature of about 80° C. for about 90 seconds, thereby forming a resist film 201 having a thickness of about 1 µm. At this point, no peeling is observed and the resist film 201 shows satisfactory adhesion During this pre-baking process, no acid is generated from the copolymer represented by Chemical Formula 11.

Next, by using a mask 203, the resist film 201 is irradiated with an ArF excimer laser beam 204 as an energy beam, thereby transferring the pattern of the mask 203 onto the resist film 201. Then, O-phenylacetyl-acetonaphtoneoxime is decomposed to generate benzylamine on the surface of an exposed area 201a of the resist film 201.

Next, a pre-baking process is performed on the resist film 201 for about 90 seconds at a temperature of about 120° C. As represented by the chemical reaction in Chemical Formula 13, sulfonic acid is generated from the copolymer represented by Chemical Formula 11 because of the heat generated by the pre-baking process.

[Chemical Formula 13]

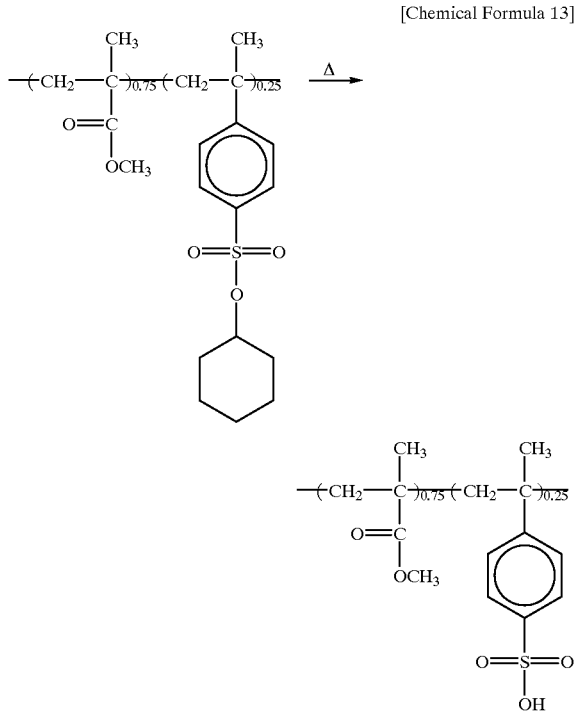

An unexposed area 201b of the resist film 201 shows strong acidic properties owing to the function of a sulfonic acid group shown in Chemical Formula 13. On the other hand in the exposed area 201a of the resist film 201, O-phenylacetyl-acetonaphtone-oxime is decomposed to generate benzylamine having basic properties. Since benzylamine cancels the acidic properties resulting from the function of the sulfonic acid group, a neutralization proceeds to a certain degree.

Since the unexposed area 201b of the resist film 201 shows the strong acidic properties, water is more easily adsorbed into the unexposed area 201b as compared with the exposed area 201a which has been neutralized. In other words, since a group having strong acidic properties exists in the unexposed area 201b, hydrogen bonding with water is strengthened in the unexposed area 201b and thus water is more likely to be absorbed thereto. In contrast, in the exposed area 201a, hydrogen bonding with water is weakened by the neutralization and thus water is less likely to be absorbed thereto.

Next, as shown in FIG. 2(b), the semiconductor substrate 200 is retained in the air having a relative humidity of about 95% at a temperature of about 30° C. for about 30 minutes, thereby supplying water vapor 205 onto the surface of the resist film 201. Then, water vapor 205 is adsorbed into the surface of the unexposed area 201b, into which water is more likely to be adsorbed, and the adsorbed water diffuses into a deep level, for example, at a depth of about 100 nm from the surface of the unexposed area 201b. Since the exposed area 201a has been neutralized, water is less likely to be adsorbed thereto. As a result, a water-adsorbing layer 206 is selectively formed in the unexposed area 201b.

Then, as shown In FIG. 2(c), while retaining the semiconductor substrate 200 in the air having a relative humidity of about 95% at a temperature of about 30° C., vapor 207 of methyltrimethoxysilane (MTMOS) Is sprayed as a metal alkoxide onto the surface of the resist film 201 for about 20 minutes. As a result, a metal oxide film 208 is selectively formed on the surface of the unexposed area 201b of the resist film 201. In this case, the acid ($H^+$) derived from sulfonic acid works as a catalyst to produce the hydrolysis and the dehydration of MTMOS, thereby forming the metal oxide film 208. Therefore, the metal oxide film 208 grows only in the area where both the acid ($H^+$) serving as the catalyst and water exist.

In the third embodiment, no metal oxide film is formed in the exposed area 201a of the resist film 201 because sulfonic acid is neutralized by the generated benzylamine and loses its function as a catalyst and because water is less likely to be absorbed thereto. In contrast, the metal oxide film 208 is formed in the unexposed area 201b of the resist film 201 because $H^+$ serving as a catalyst exists there and a sufficient amount of water has been absorbed thereto.

Next, as shown in FIG. 2(d), by using the metal oxide film 208 as a mask, an RIE (reactive ion etching) process is performed by using $O_2$ plasma 209, thereby forming a resist pattern 210. In this case, the RIE process using $O_2$ plasma is performed by using a parallel plate RIE system under the conditions where a power of about 900 W is supplied, a pressure of about 0.7 Pa is applied and a flow rate is set at about 40 SCCM.

In the third embodiment, since the metal oxide film 208 is selectively formed only in the unexposed area 201b and etching is performed by using the metal oxide film 208 as a mask, a positive type resist pattern 210 having a vertical cross-sectional shape and a width of about 0.15 $\mu$m can be formed in the unexposed area 201b.

Furthermore, since water vapor 205 is supplied to the resist film 201 in the process step shown in FIG. 2(b), water diffuses from the surface of the unexposed area 201b of the resist film 201 into a deep level. Thus, the metal oxide film 208 grows so as to extend toward the inside of the resist film 201. As a result, a metal oxide film 208 having a large thickness can be formed.

In addition, since MTMOS is supplied to the resist film 201 in the air having a relative humidity of about 95% in the process step shown in FIG. 2(c), the equilibrium of water can be maintained. This is because it is possible to prevent the water, which has been absorbed into the resist film 201, from evaporating therefrom and because a sufficient amount of water required for forming the metal oxide film 208 can be supplied thereto. As a result, a metal oxide film 208 thick enough to withstand the RIE process using $O_2$ plasma can be formed.

As described above, in this third embodiment, the resist film 201 is exposed to light, thereby generating a base in the exposed area 201a. Thereafter, an acid is generated from the copolymer by heating the film, thereby neutralizing the basic properties of the exposed area 201a, while the metal oxide film 208 is selectively formed only in the unexposed area 201b. Then, by using the metal oxide film 208 as a mask, the resist film 201 is etched. Thus, it is possible to form a positive type fine resist pattern 210 having a desired shape.

Also, since water is forcedly absorbed into the unexposed area 201b before the metal oxide film 208 is grown, it is possible to form a metal oxide film 208 having a sufficiently large thickness required for the dry development by the RIE process using $O_2$ plasma.

In this embodiment, MTMOS is used as a metal alkoxide. Alternatively, any other metal alkoxide such as $CH_3Si(OC_2H_5)_3$ (methyltriethoxysilane), $Si(OCH_3)_4$ (tetramethoxysilane), $Si(OC_2H_5)_4$ (tetraethoxysilane), $Ti(OC_2H_5)_4$, $Ge(OC_2H_5)_4$, $Al(OC_2H_5)_3$ or $Zr(OC_2H_5)_3$ may be supplied in a vapor phase or in a liquid phase.

Also, the dry development is performed by the RIE process using $O_2$ plasma in this embodiment. As an alternative, an ECR (electron cyclotron resonance) etching process using $O_2$ plasma may be performed. Moreover, a mixture gas in which $SO_2$ gas or the like is added to $O_2$ gas may be used as an alternative etching gas.

Furthermore, the exposing radiation is assumed to be an ArF excimer laser beam in this embodiment. Alternatively, an i-beam, a KrF excimer laser beam, VUV, EUV, EB, an X-ray or the like may also be used.

Furthermore, in the process step of diffusing water in the surface region of the unexposed area 201b of the resist film 201, the semiconductor substrate 200 is retained within water vapor in this embodiment. Alternatively, water in a liquid phase may be supplied to the resist film 201 on the semiconductor substrate 200. However, water can be more rapidly diffused and the depth of the metal oxide film 208 can be increased when water is supplied in a vapor phase than in a liquid phase. Thus, water is preferably supplied in a vapor phase.

Embodiment 4

FIGS. 3(a) through 3(c) and FIGS. 4(a) and 4(b) are cross-sectional views showing the respective process steps of a pattern forming method in the fourth embodiment of the present invention.

A mixture obtained by dissolving, in diglyme, a copolymer represented by Chemical Formula 14 (i.e., a polymer including a group which generates an acid when the polymer is irradiated with the second energy beam (an i-beam)) and a compound represented by Chemical Formula 15 (i.e., a compound which generates a base when the compound is irradiated with the first energy beam (an ArF excimer laser beam)) is used as a resist material.

[Chemical Formula 14]

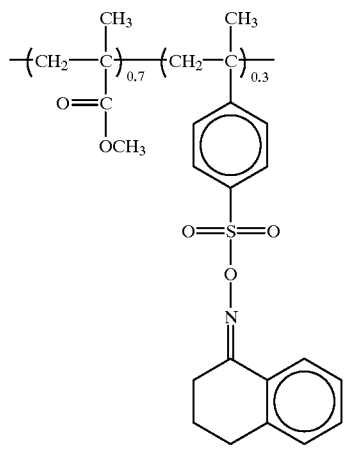

[Chemical Formula 15]

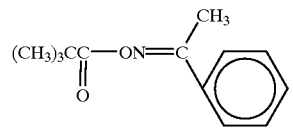

Figure 3A:
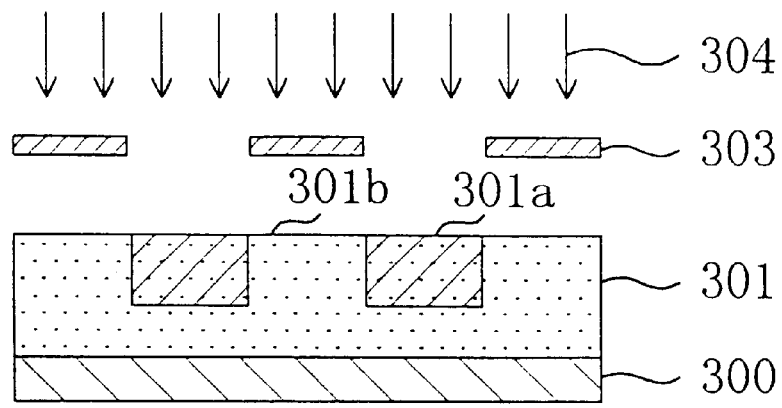
FIGS. 3(a) through 3(c) are cross-sectional views showing the preceding process steps of a pattern forming method in the fourth embodiment of the present invention.

First, as shown in FIG. 3(a), the resist material is spin-coated onto a semiconductor substrate 300 made of silicon, and the coated semiconductor substrate is heated at a temperature of about 90° C. for about 90 seconds, thereby forming a resist film 301 having a thickness of about 1 μm. At this point, no peeling is observed, and the resist film 301 shows satisfactory adhesion.

Next, by using a mask 303, the resist film 301 is irradiated with an ArF excimer laser beam 304 as the first energy beam, thereby transferring the pattern of the mask 303 onto the resist film 301. Then, O-tertiary butylacetylacetophenone-oxime is decomposed to generate amine on the surface of an exposed area 301a of the resist film 301, as represented by the chemical reaction in Chemical Formula 16.

[Chemical Formula 16]

$(CH_3)_3CC(=O)-ON=C(CH_3)(C_6H_5) \xrightarrow{h\nu} (CH_3)_3CNH_2$

Figure 3B:
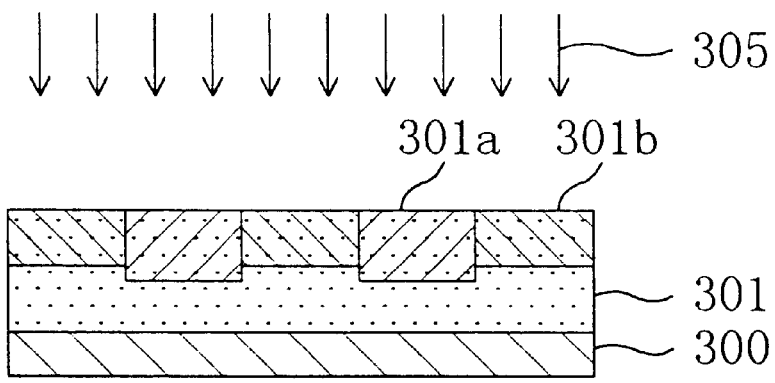

Next, as shown in FIG. 3(b), the entire surface of the resist film 301 is exposed to an i-beam 305 as the second energy beam. Then, in the exposed area 301a, which has been exposed to the ArF excimer laser beam 304, sulfonic acid having acidic properties is generated in accordance with the exposure of the entire surface of the resist film 301 to the i-beam 305, as represented by the chemical reaction in Chemical Formula 9. As a result, the exposed area 301a is neutralized.

On the other hand, the unexposed area 301b of the resist film 301, which has not been exposed to the ArF excimer laser beam 304, shows acidic properties, because sulfonic acid is generated therein in accordance with the exposure of the entire surface of the resist film 301 to the i-beam 305, as represented by the chemical reaction in Chemical Formula 17. In this case, since the unexposed area 301b shows strong acidic properties, water is more likely to be adsorbed thereto, as compared with the exposed area 301a which has been neutralized.

[Chemical Formula 17]

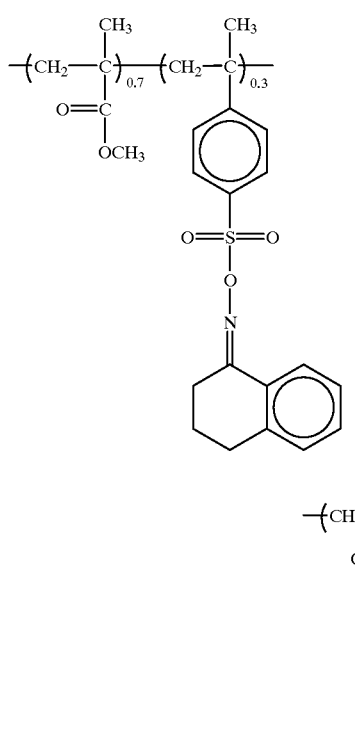

Next, as shown in FIG. 3(a), the semiconductor substrate 300 is retained within the air having a relative humidity of about 95% at a temperature of about 30° C. for about 30 minutes, thereby supplying water vapor 307 onto the surface of the resist film 301. Then, water vapor 307 is adsorbed into the surface of the unexposed area 301b, into which water is more likely to be adsorbed, and the adsorbed water diffuses into a deep level, for example, at a depth of about 100 nm from the surface of the unexposed area 301b. Since the exposed area 301a has been neutralized, water is less likely to be adsorbed thereto. As a result, a water-adsorbing layer 308 is selectively formed in the unexposed area 301b.

Figure 4A:
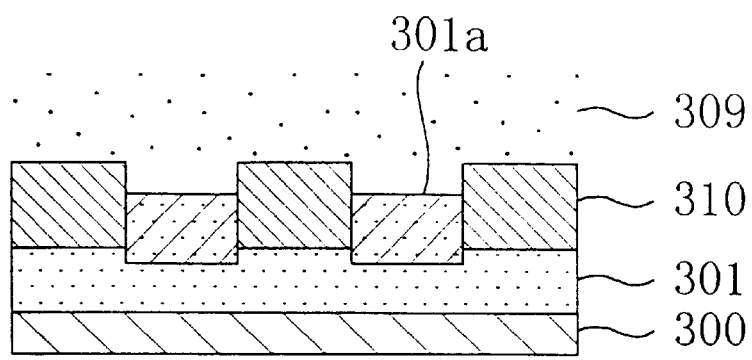
FIGS. 4(a) and 4(b) are cross-sectional views showing the succeeding process steps of the pattern forming method in the fourth embodiment of the present invention.

Then, as shown in FIG. 4(a), while retaining the semiconductor substrate 300 within the air having a relative humidity of about 95% at a temperature of about 30° C., vapor 309 of methyltriethoxysilane (MTEOS) is sprayed as a metal alkoxide onto the surface of the resist film 301 for about 30 minutes. As a result, a metal oxide film 310 is selectively formed on the surface of the unexposed area 301b of the resist film 301. In this case, an acid ($H^+$) derived from sulfonic acid works as a catalyst to produce the hydrolysis and the dehydration of MTEOS, thereby forming the metal oxide film 310. Therefore, the metal oxide film 310 is formed only in the area where both the acid ($H^+$) serving as the catalyst and water exist.

In the fourth embodiment, no metal oxide film is formed in the exposed area 301a of the resist film 301 because amine is neutralized by the generated sulfonic acid and loses its function as a catalyst and because water is less likely to be absorbed thereto. In contrast, the metal oxide film 310 is formed in the unexposed area 301b of the resist film 301 because the acid serving as the catalyst exists there and a sufficient amount of water has been absorbed thereto.

Figure 4B:
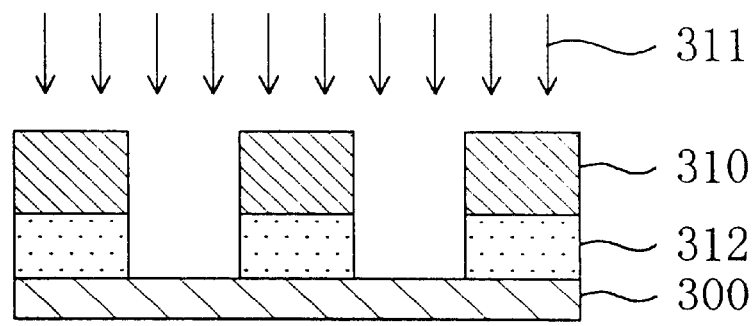

Next, as shown in FIG. 4(b), by using the metal oxide film 310 as a mask, an RIE (reactive ion etching) process is performed by using $O_2$ plasma 311, thereby forming a resist pattern 312. In this case, the RIE process using $O_2$ plasma is performed by using a parallel plate RIE system under the conditions where a power of about 900 W is supplied, a pressure of about 0.7 Pa is applied and a flow rate is set at about 40 SCCM.

In the fourth embodiment, since the metal oxide film 310 is selectively formed only in the unexposed area 301b and the etching is performed by using the metal oxide film 310 as a mask, a positive type resist pattern 312 having a vertical cross-sectional shape and a width of about 0.15 $\mu$m can be formed in the unexposed area 301b.

Figure 3C:
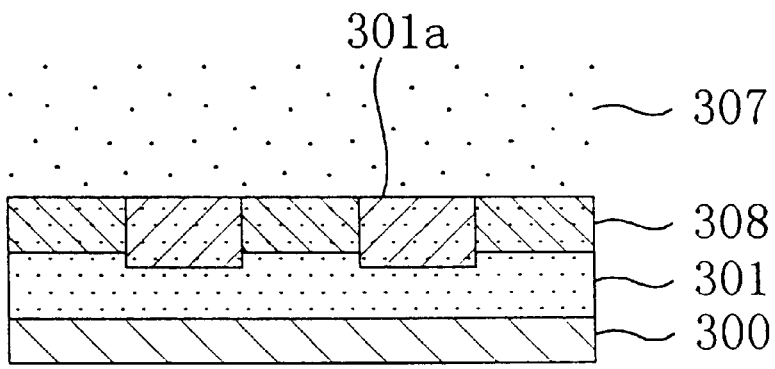

Furthermore, since water vapor 307 is supplied to the resist film 301 in the process step shown in FIG. 3(c), water diffuses from the surface of the unexposed area 301b of the resist film 301 into a deep level. Thus, the metal oxide film 310, grows so as to extend toward the inside of the resist film 301. As a result, a metal oxide film 310 having a large thickness can be formed. In particular, since the acid is generated only in the surface region of the resist film 301, the thickness of the water adsorbing layer 308 can be limited so as not to exceed the depth of the region where the acid has been generated. Thus, it is possible to prevent water from making a detour to reach the regions under the exposed area 301a.

In addition, since MTEOS is supplied to the resist film 301 in the air having a relative humidity of about 95% in the process step shown in FIG. 4(a), the equilibrium of water can be maintained. This is because it is possible to prevent the water, which has been absorbed into the resist film 301, from evaporating therefrom and because a sufficient amount of water required for forming the metal oxide film 310 can be supplied thereto. As a result, a metal oxide film 310 thick enough to withstand the RIE process using $O_2$ plasma can be formed.

As described above, in this fourth embodiment, first, the resist film 301 is exposed to the first energy beam, thereby generating a base in the exposed area 301a. Thereafter, the entire surface of the resist film 301 is exposed to the second energy beam, thereby generating an acid and neutralizing the exposed area 301a which has been subjected to an exposure. On the other hand, the unexposed area 301b is acidified, thereby selectively forming the metal oxide film 310 only in the unexposed area 301b. And then the resist film 301 is etched by using the metal oxide film 310 as a mask. Thus, it is possible to form a positive type fine resist pattern 312 having a desired shape.

Also, since water is forcedly absorbed into the unexposed area 301b before the metal oxide film 310 is grown, it is possible to form a metal oxide film 310 having a sufficiently large thickness required for the dry development by the RIE process using $O_2$ plasma.

In this embodiment, MTEOS is used as a metal alkoxide. Alternatively, any other metal alkoxide such as $CH_3Si(OCH_3)_3$ (methyltrimethoxysilane), $Si(OCH_3)_4$ (tetramethoxysilane), $Si(OC_2H_5)_4$ (tetraethoxysilane), $Ti(OC_2H_5)_4$, $Ge(OC_2H_5)_4$, $Al(OC_2H_5)_3$ or $Zr(OC_2H_5)_3$ may be supplied in a vapor phase or in a liquid phase.

Also, the dry development is performed by the RIE process using $O_2$ plasma in this embodiment. As an alternative, an ECR (electron cyclotron resonance) etching process using $O_2$ plasma may be performed. Moreover, a mixture gas in which $SO_2$ gas or the like is added to $O_2$ gas may be used as an alternative etching gas.

Furthermore, the exposing radiation is assumed to be an ArF excimer laser beam in this embodiment. Alternatively, an i-beam, a KrF excimer laser beam, VUV, EUV, EB, an X-ray or the like may also be used.

Furthermore, in the process step of diffusing water in the surface region of the unexposed area 301b of the resist film 301, the semiconductor substrate 300 is retained within water vapor in this embodiment. Alternatively, water in a liquid phase may be supplied to the resist film 301 on the semiconductor substrate 300. However, water can be more rapidly diffused and the depth of the metal oxide film 310 can be increased when water is supplied in a vapor phase than in a liquid phase. Thus, water is preferably supplied in a vapor phase.

Variant of Embodiment 4

In this variant, a mixture of a polymer (e.g., a copolymer represented by Chemical Formula 14) including a group which generates an acid when the polymer is irradiated with the first energy beam (e.g., i-beam) and a compound (e.g., a compound represented by Chemical Formula 15) which generates a base when the compound is irradiated with the second energy beam (e.g., ArF excimer laser beam) is used as a resist material.

First, the entire surface of a resist film is exposed to the first energy beam, thereby generating an acid from the copolymer. Then, the resist film is exposed to the second energy beam, thereby generating a base in the area of the resist film which has been exposed to the second energy beam. In such a case, in the area of the resist film which has been exposed to the second energy beam, the acid which has been generated from the copolymer is neutralized with the base which has been generated from the compound.

On the other hand, in the area of the resist film, which has not been exposed to the second energy beam, the acid, which has been generated from the copolymer, is left. Thus, if water vapor and alkoxy silane are supplied to the unexposed area after water is absorbed by supplying water vapor thereto, then a metal oxide film is formed therein.

Next, by etching the resist film by using the metal oxide film as a mask, a resist pattern is formed.

In this variant of Embodiment 4, a positive type fine resist pattern having a desired shape can also be formed in the same way as in the first to the fourth embodiments.

In the first to the fourth embodiments and in this variant of Embodiment 4, a copolymer represented by Chemical Formula 3, a copolymer represented by Chemical Formula 7, a copolymer represented by Chemical Formula 11 and a copolymer represented by Chemical Formula 14 are used as the respective polymers. Alternatively, any other copolymer, such as those represented by Chemical Formulae 18 to 24, including a group which generates sulfonic acid may also be used. Moreover, a polymer including a group having strong acidic properties may also be used instead of the polymer including a group which generates sulfonic acid.

[Chemical Formula 18]

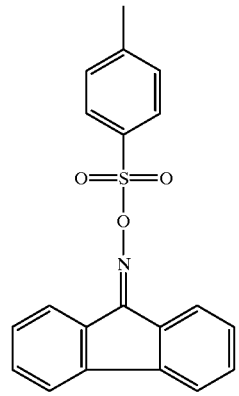

[Chemical Formula 19]

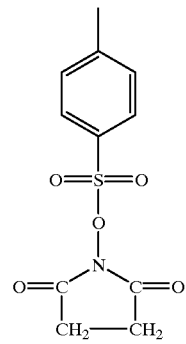

[Chemical Formula 20]

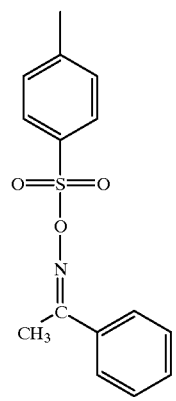

[Chemical Formula 21]

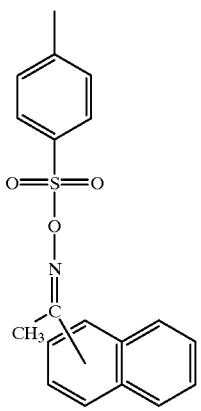

[Chemical Formula 22]

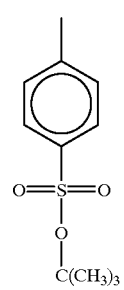

[Chemical Formula 23]

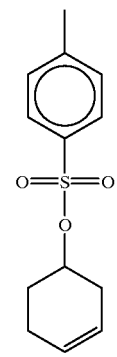

[Chemical Formula 24]

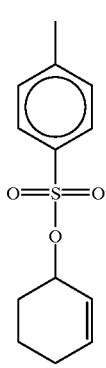

It is noted that the ratio of the group which generates sulfonic acid or the group having strong acidic properties to the copolymer may be set at an arbitrary value. However, in order to facilitate the neutralization with the base, the ratio is preferably equal to or lower than about 50 mol %.

In addition, in the first to the fourth embodiments and in this variant of Embodiment 4, any compound, such as those represented by Chemical Formulae 25 to 30, including a group which generates amine may be used as the compound which generates a base. Moreover, a compound which generates a group having basic properties may also be used instead of the compound including a group which generates amine.

[Chemical Formula 25]

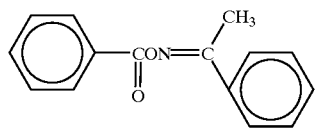

[Chemical Formula 26]

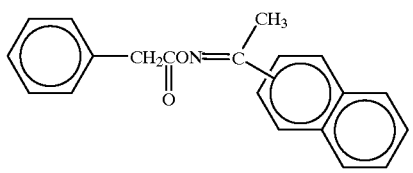

[Chemical Formula 27]

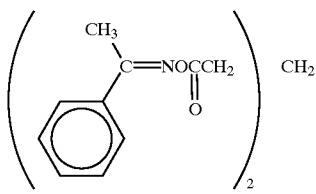

[Chemical Formula 28]

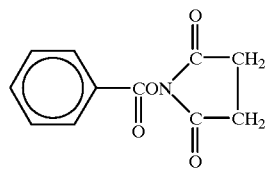

[Chemical Formula 29]

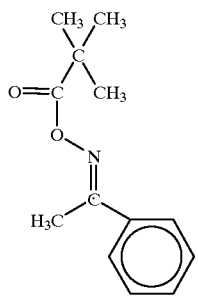

[Chemical Formula 30]

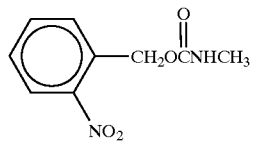

Moreover, in the first to the fourth embodiments and in this variant of Embodiment 4, a polymer including a group which generates sulfonic acid is used. Alternatively, a binary polymer obtained by polymerizing a group, such as that represented by Chemical Formula 31, with the sulfonic acid generating group may be used instead.

[Chemical Formula 31]

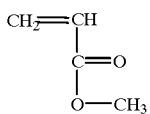

Furthermore, in the fourth embodiment, the exposing radiation for the exposure with the first energy beam is assumed to be an ArF excimer laser beam. Alternatively, an i-beam, a KrF excimer laser beam, EB, an X-ray or the like may also be used. In such a case, it is necessary to use a compound which generates a base upon the irradiation of these energy beam in place of the compound represented by Chemical Formula 15. Also, the exposing radiation for exposing the entire surface to the second energy beam is assumed to be an i-beam. Alternatively, any other beam may also be used. In such a case, it is necessary to use a polymer including a group which generates an acid upon the irradiation of other energy beam instead of the polymer represented by Chemical Formula 14.

In the first to the fourth embodiments, since the selectivity of the metal oxide film functioning as a surface modification film is not satisfactory, some residue of the metal oxide film is adversely formed on the semiconductor substrate on which the resist pattern has been formed.

Thus, it has been analyzed how benzylamine is generated by the decomposition of O-phenylacetyl-acetophenone-oxime when the surface of the resist film is exposed to energy beam in the first embodiment. The mechanism how benzylamine is generated by the decomposition of O-phenylacetyl-acetophenone-oxime is as represented by Chemical Formula 32.

[Chemical Formula 32]

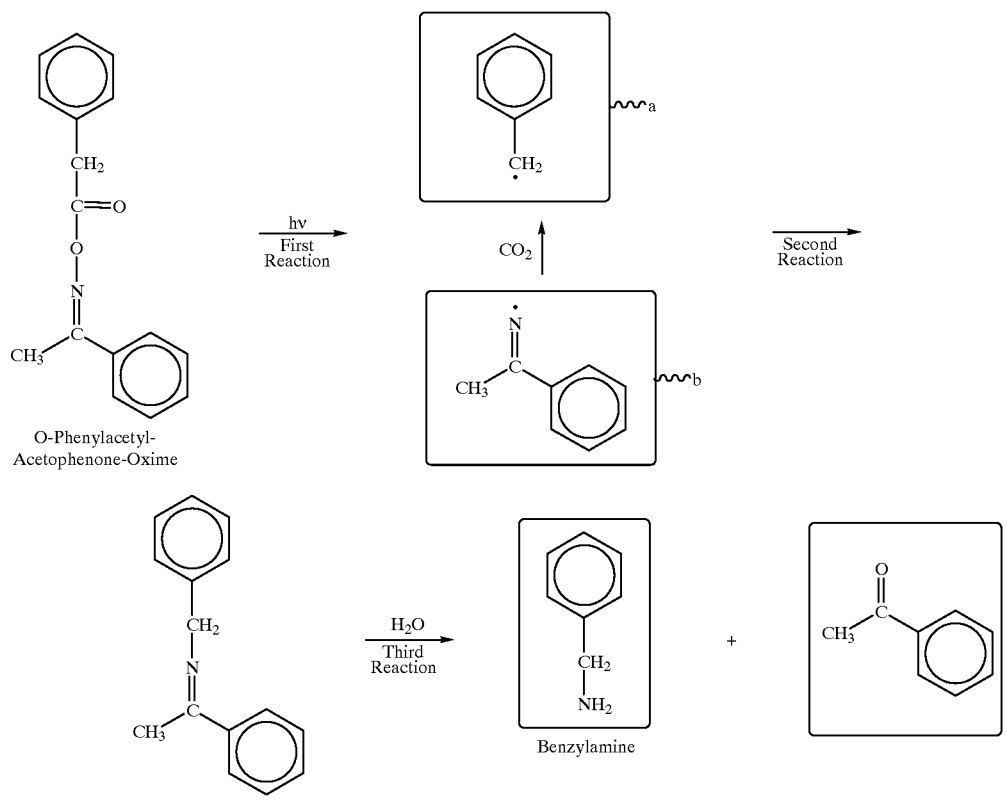

First, when light is irradiated onto O-phenylacetyl-acetophenone-oxime, the first reaction, i.e., a radical decomposition, is generated therein, so that O-phenylacetyl-acetophenone-oxime is decomposed into Radical a, $CO_2$ and Radical b. Thereafter, when the second reaction is generated, Radicals a and b are recombined. And then the third reaction, i.e., a hydrolysis with water in the air, occurs, thereby producing benzylamine.

In order to reduce the amount of the residue by increasing the amount of the base ($OH^-$) generated in the unexposed area of the resist film, the present inventors repeatedly conducted experiments by increasing the amount of the ArF excimer laser beam as the exposing radiation. However, the residue could not be totally eliminated from the surface of the semiconductor substrate.

On the other hand, when we caused the chemical reactions represented by Chemical Formula 32 under various environments, we found that the amount of benzylamine to be produced differs depending upon the environment within which the chemical reactions occur and also found that the second reaction represented by Chemical Formula 32 is inhibited as a result of the influence of some impurity, such as carbon, existing in the air. That is to say, though the third reaction represented by Chemical Formula 32, i.e., the hydrolysis with water in the air, is necessary, the second reaction is inhibited by the impurity such as carbon existing in the air during the hydrolysis.

Hereinafter, a method for reducing the amount of the residue of the metal oxide film remaining on the semiconductor substrate after the resist pattern has been formed thereon will be described.

Embodiment 5

Hereinafter, a pattern forming method in the fifth embodiment of the present invention will be described with reference to FIGS. 5(a) to 5(c) and FIGS. 6(a) to 6(c).

Figure 5A:
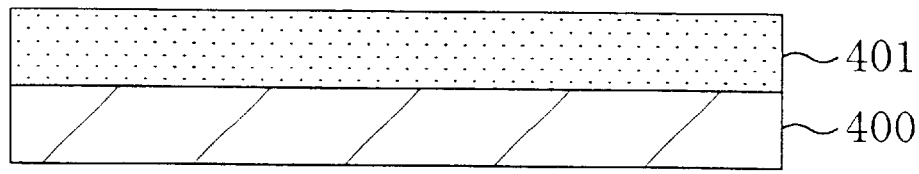
FIGS. 5(a) through 5(c) are cross-sectional views showing the preceding process steps of a pattern forming method in the fifth embodiment of the present invention.

First, as shown in FIG. 5(a), a resist material having the following composition is applied onto the surface of a semiconductor substrate 400, thereby forming a resist film 401 having a thickness of about 0.5 μm.

| Polymer | Poly (propylideneiminostyrene sulfonate (14 mol %)-co-methyl methacrylate (86 mol %)) | 10 g |
| Base-generating Compound | O-phenylacetyl-acetophenone-oxime | 2.3 g |
| Solvent | Diglyme | 40 g |

Figure 5B:
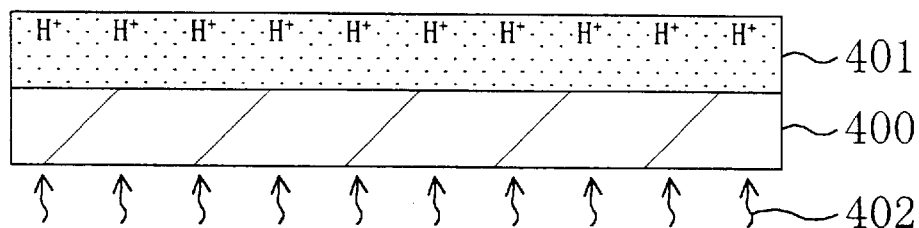

Next, the resist film 401 is heated (402) by a hot plate for about 60 seconds at a temperature of about 90° C., thereby generating an acid ($H^+$) over the entire surface region of the resist film 401 as shown in FIG. 5(b).

Figure 5C:
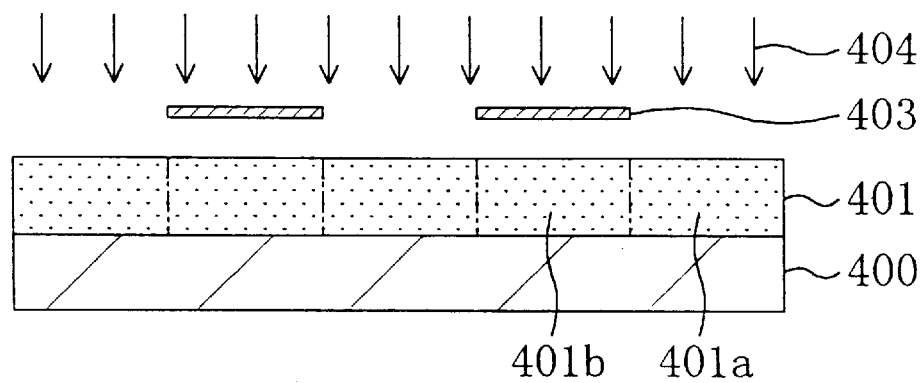

Next, as shown in FIG. 5(c), the resist film 401 is exposed to an ArF excimer laser beam 404 (NA: about 0.55) at an energy of about 250 mJ/cm$^2$ by using a mask 403 having a desired pattern shape. It is noted that the reference numeral 401a denotes an exposed area and 401b denotes an unexposed area in FIG. 5(c).

Figure 6A:
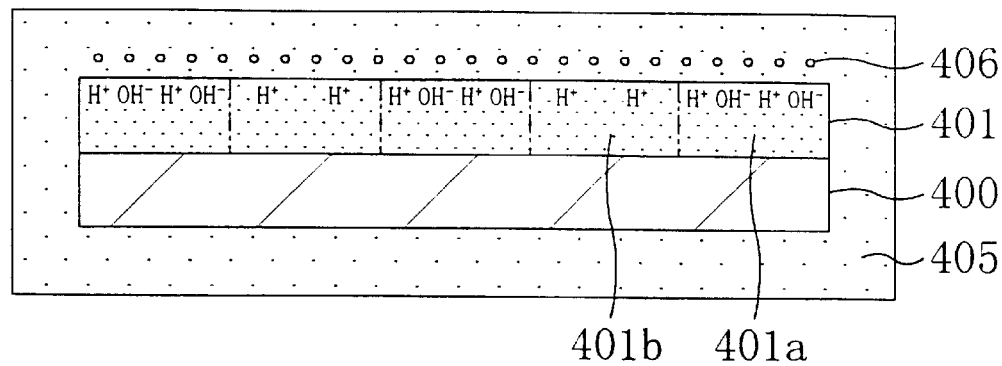
FIGS. 6(a) through 6(c) are cross-sectional views showing the succeeding process steps of the pattern forming method in the fifth embodiment of the present invention.

Subsequently, as shown in FIG. 6(a), a water vapor treatment for supplying water vapor 406 onto the entire surface of the resist film 401 is performed within an environment of $N_2$ gas 405. In such a case, since the reaction is not inhibited by the impurity in the air, a sufficient amount of base (OH⁻) of benzylamine is produced from O-phenylacetyl-acetophenone-oxime as the base-generating compound in the exposed area 401a of the resist film 401, and the acid (H⁺) existing in the resist film 401 is neutralized substantially completely with the sufficient amount of base (OH⁻) which has been produced.

Figure 6B:
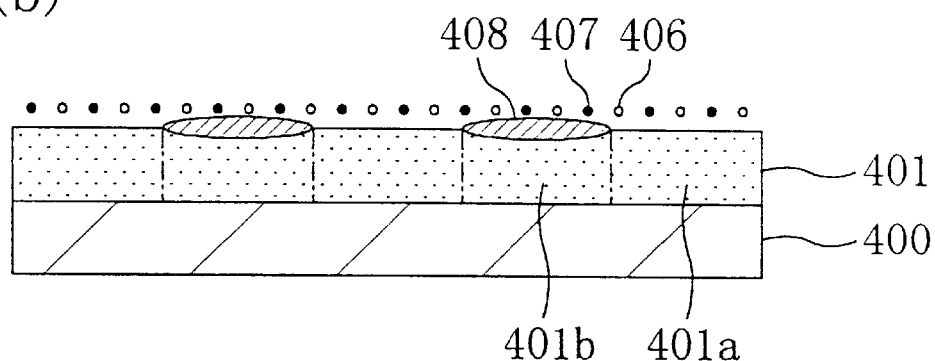

Then, as shown in FIG. 6(b), a water vapor treatment for supplying water vapor 406 and a chemical vapor deposition (CVD) process for supplying methyltrimethoxysilane 407 are performed on the entire surface of the resist film 401. As a result, a polysiloxane film 408 is formed as a metal oxide film only in the unexposed area 401b of the resist film 401.

Next, as shown in FIG. 6(a), the resist film 401 is dry-etched by O₂ gas 409 by using the polysiloxane film 408 as a mask, thereby developing the film and forming a resist pattern 410. In such a case, no residue is formed in the exposed area 401a of the resist film 401.

In the fifth embodiment, since the water vapor treatment for supplying water vapor 406 onto the entire surface of the resist film 401 is performed within an environment of N₂ gas 405, the second reaction represented by Chemical Formula 32 is not inhibited and the third reaction represented by Chemical Formula 32 is promoted. As a result, it is possible to improve the efficiency with which the base is generated from the base-generating compound.

Embodiment 6

Hereinafter, a pattern forming method in the sixth embodiment of the present invention will be described with reference to FIGS. 5(a) to 5(c), FIGS. 6(b) and 6(c) and FIGS. 7(a) and 7(b).

First, as shown in FIG. 5(a), a resist material having the same composition as that of the material used in the fifth embodiment is applied onto the surface of a semiconductor substrate 400, thereby forming a resist film 401. Next, the resist film 401 is heated (402) by a hot plate for about 60 seconds at a temperature of about 90° C., thereby generating an acid (H⁺) over the entire surface region of the resist film 401 as shown in FIG. 5(b). Thereafter, as shown in FIG. 5(c), the resist film 401 is exposed to an ArF excimer laser beam 404 through a mask 403 having a desired pattern shape.

Figure 7A:
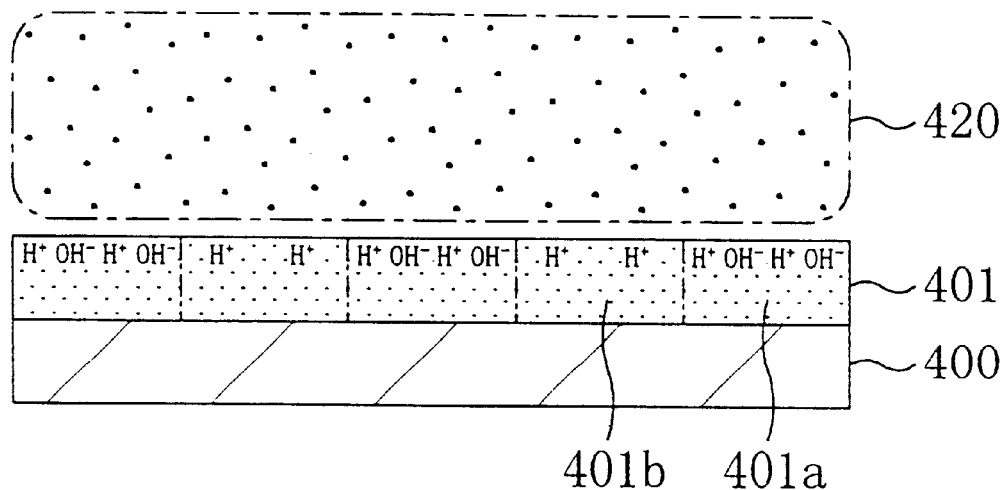
FIGS. 7(a) and 7(b) are cross-sectional views showing the respective process steps of a pattern forming method in the sixth embodiment of the present invention.

Subsequently, as shown in FIG. 7(a), water 420 in a liquid phase or in a vapor phase is supplied onto the entire surface of the resist film 401. In such a case, since O-phenylacetyl-acetophenone-oxime functioning as the base-generating compound absorbs a large quantity of water, a sufficient amount of base (OH⁻) of benzylamine is produced from O-phenylacetyl-acetophenone-oxime in the exposed area 401a of the resist film 401, and the acid (H⁺) existing in the resist film 401 is neutralized substantially completely with the sufficient amount of base (OH⁻) which has been produced.

Figure 7B:
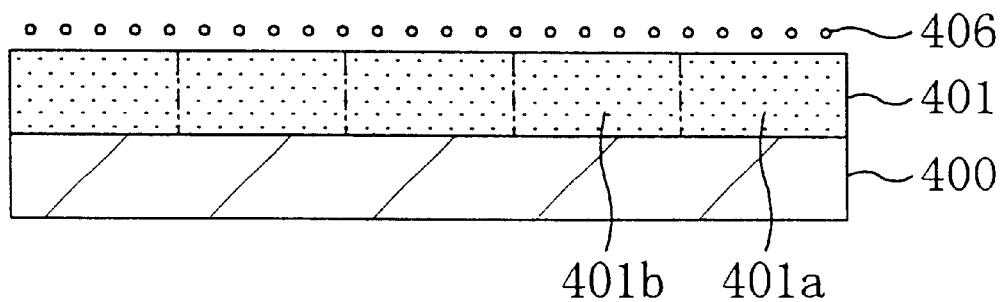

Then, as shown in FIG. 7(b), a water vapor treatment for supplying water vapor 406 is performed on the entire surface of the resist film 401. Subsequently, as shown in FIG. 6(b), a water vapor treatment for supplying water vapor 406 and a chemical vapor deposition (CVD) process for supplying methyltrimethoxysilane 407 are performed on the entire surface of the resist film 401. As a result, a polysiloxane film 408 is formed as a metal oxide film only in the unexposed area 401b of the resist film 401.

Next, as shown in FIG. 6(a), the resist film 401 is dry-etched by O₂ gas 409 by using the polysiloxane film 408 as a mask, thereby developing the film and forming a resist pattern 410. In such a case, no residue is formed in the exposed area 401a of the resist film 401.

In the sixth embodiment, since water 420 in a vapor phase or in a liquid phase is supplied onto the resist film 401, the third reaction represented by Chemical Formula 32 is promoted. As a result, it is possible to improve the efficiency with which the base is generated from the base-generating compound.

Embodiment 7

Hereinafter, a pattern forming method in the seventh embodiment of the present invention will be described with reference to FIGS. 5(a) to 5(c), FIGS. 6(b) and 6(c) and FIGS. 8(a) and 8(b).

First, as shown in FIG. 5(a), a resist material having the same composition as that of the material used in the fifth embodiment is applied onto the surface of a semiconductor substrate 400, thereby forming a resist film 401. Next, the resist film 401 is heated (402) by a hot plate for about 60 seconds at a temperature of about 90° C., thereby generating an acid (H⁺) over the entire surface region of the resist film 401 as shown in FIG. 5(b). Thereafter, as shown in FIG. 5(c), the resist film 401 is exposed to an ArF excimer laser beam 404 by using a mask 403 having a desired pattern shape.

Figure 8A:
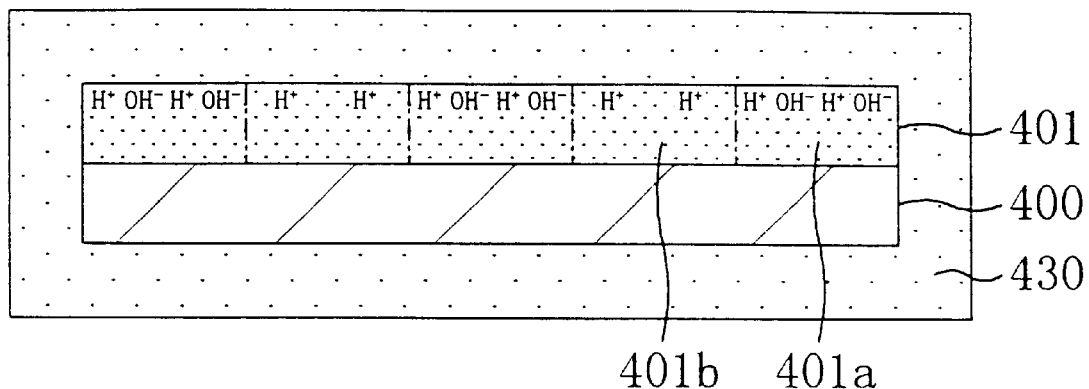
FIGS. 8(a) and 8(b) are cross-sectional views showing the respective process steps of a pattern forming method in the seventh embodiment of the present invention.

Subsequently, as shown in FIG. 8(a), the resist film 401 is retained within an environment of N₂ gas 430. In such a case, since the reaction is not inhibited by the impurity in the air, a sufficient amount of base (OH⁻) of benzylamine is produced from O-phenylacetyl-acetophenone-oxime functioning as the base-generating compound in the exposed area 401a of the resist film 401, and the acid (H⁺) existing in the resist film 401 is neutralized substantially completely with the sufficient amount of base (OH⁻) which has been produced.

Figure 8B:
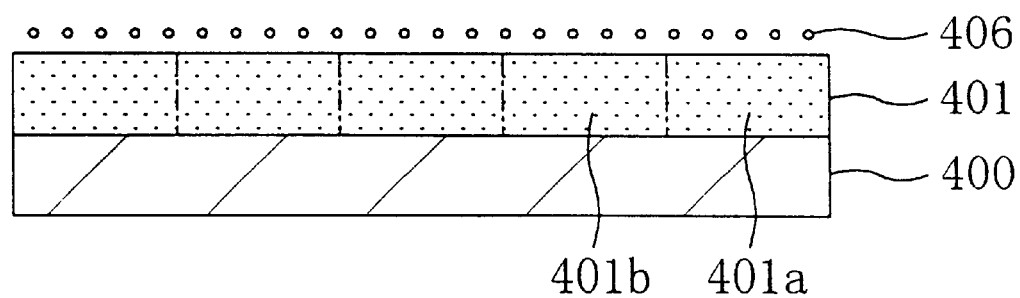
Figure 9A:
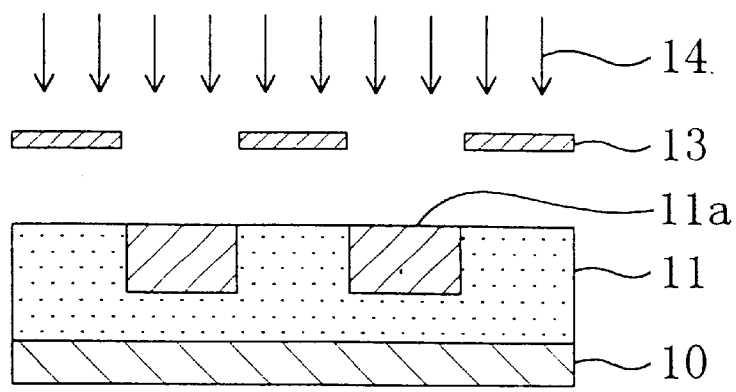
FIGS. 9(a) through 9(d) are cross-sectional views showing the respective process steps of a conventional pattern forming method.
Figure 9B:
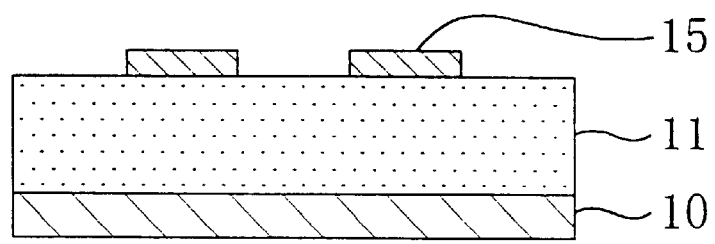
Figure 9C:
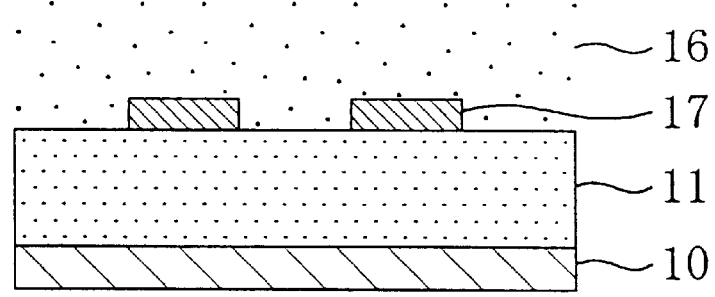
Figure 9D:
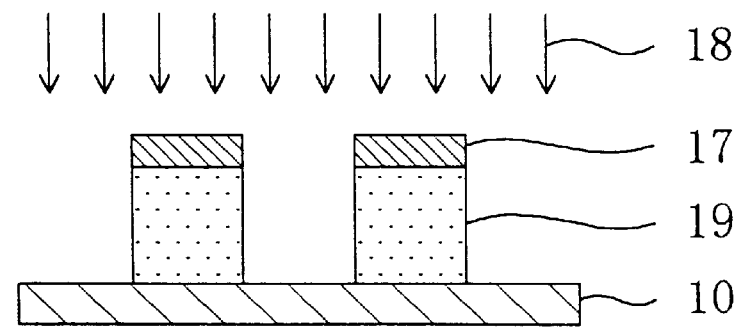

Then, as shown in FIG. 8(b), a water vapor treatment for supplying water vapor 406 is performed on the entire surface of the resist film 401. Subsequently, as shown in FIG. 6(b), a water vapor treatment for supplying water vapor 406 and a chemical vapor deposition (CVD) process for supplying methyltrimethoxysilane 407 are performed on the entire surface of the resist film 401. As a result, a polysiloxane film 408 is formed as a metal oxide film only in the unexposed area 401b of the resist film 401.

Figure 6C:
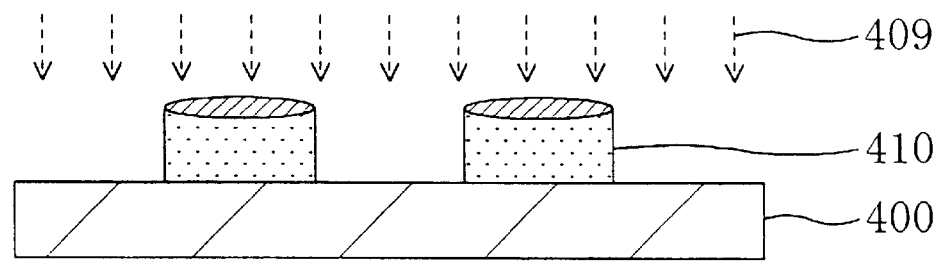

Next, as shown in FIG. 6(c), the resist film 401 is dry-etched by O₂ gas 409 by using the polysiloxane film 408 as a mask, thereby developing the film and forming a resist pattern 410. In such a case, no residue is formed in the exposed area 401a of the resist film 401.

In the seventh embodiment, since the resist film 401 is retained within an environment of N₂ gas 430, the second reaction represented by Chemical Formula 32 is not inhibited. As a result, it is possible to improve the efficiency with which the base is generated from the base-generating compound.

In the fifth and the seventh embodiments, the N₂ gas 405, 430 is used as an inert gas. Alternatively, any other inert gas such as Ar gas may also be used.

Moreover, in the fifth to the seventh embodiments, methyltrimethoxysilane 407 is supplied as alkoxy silane. Alternatively, methyltriethoxysilane, ethyltriethoxysilane, ethyltrimethoxysilane or the like may also be supplied. It is noted that the present invention is not limited to any of these compounds.

Furthermore, in the fifth to the seventh embodiments, the dry etching process is performed by using $O_2$ gas. Alternatively, a mixture gas in which $SO_2$ gas or the like is added to $O_2$ gas may also be used as an etching gas.

Furthermore, in the fifth to the seventh embodiments, the exposing radiation is assumed to be an ArF excimer laser beam. However, the present invention is not limited thereto, but VUV light such as $F_2$ light and light having a wavelength of about 13 nm, an electron beam, an X-ray or the like may also be used.

What is claimed is:

1. A pattern forming material comprising
   a polymer including a group which generates an acid when the polymer is heated and
   a compound which generates a base when the compound is irradiated with an energy beam.
2. The pattern forming material of claim 1,
   wherein said polymer is a binary polymer or a polymer of a higher degree obtained by polymerizing another group with a compound represented by the following general formula:

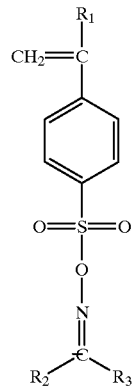

where $R_1$ indicates a hydrogen atom or an alkyl group, and $R_2$ and $R_3$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group.

3. The pattern forming material of claim 1,
   wherein said polymer is a binary polymer or a polymer of a higher degree obtained by polymerizing another group with a compound represented by the following general formula:

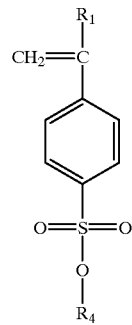

where $R_1$ indicates a hydrogen atom or an alkyl group, and $R_4$ indicates an alkyl group, an alkenyl group, a cyclic alkyl group or a cyclic alkenyl group.

4. The pattern forming material of claim 1,
   wherein the compound is acyloxime, a benzyloxycarbonyl compound or formamide.
5. A pattern forming material comprising:
   a polymer including a group which generates an acid when the polymer is irradiated with a first energy beam having a first energy band and
   a compound which generates a base when the compound is irradiated with a second energy band which is different from the first energy band
   wherein said polymer is a binary polymer or a polymer of a higher degree obtained by polymerizing another group with a compound represented by the following general formula:

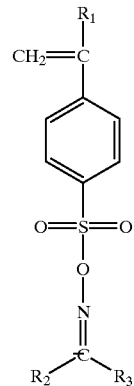

where $R_1$ indicates a hydrogen atom or an alkyl group, and $R_2$ and $R_3$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group.

* * * * *